(12) United States Patent
Sohn et al.

(10) Patent No.: US 9,900,979 B2
(45) Date of Patent: Feb. 20, 2018

(54) CONDUCTORS, MAKING METHOD OF THE SAME, AND ELECTRONIC DEVICES INCLUDING THE SAME

(71) Applicant: SAMSUNG ELECTRONICS CO., LTD., Suwon-si, Gyeonggi-do (KR)

(72) Inventors: Hiesang Sohn, Seoul (KR); Chan Kwak, Yongin-si (KR); Mi Jeong Kim, Hwaseong-si (KR); Hyeon Cheol Park, Hwaseong-si (KR); Weonho Shin, Seoul (KR); Youngjin Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/240,132

(22) Filed: Aug. 18, 2016

(65) Prior Publication Data

US 2017/0273181 A1   Sep. 21, 2017

(30) Foreign Application Priority Data

Mar. 15, 2016   (KR) .................. 10-2016-0031120

(51) Int. Cl.
| | |
|---|---|
| H05K 1/02 | (2006.01) |
| H05K 1/09 | (2006.01) |
| H05K 1/03 | (2006.01) |
| H05K 3/14 | (2006.01) |

(Continued)

(52) U.S. Cl.
CPC ........... *H05K 1/09* (2013.01); *C01B 31/0484* (2013.01); *H05K 1/0306* (2013.01); *H05K 1/0313* (2013.01); *H05K 3/146* (2013.01); *H05K 3/22* (2013.01); *H05K 2201/0145* (2013.01); *H05K 2201/0154* (2013.01); *H05K 2201/0158* (2013.01); *H05K 2201/0323* (2013.01);

(Continued)

(58) Field of Classification Search
CPC ......... H05K 1/0296; H05K 1/11; H05K 1/119
See application file for complete search history.

(56) References Cited

U.S. PATENT DOCUMENTS

| | | | |
|---|---|---|---|
| 8,597,738 B2 | 12/2013 | Yu et al. | |
| 8,920,682 B2 | 12/2014 | Texter | |
| 9,034,687 B2 | 5/2015 | Sato et al. | |

(Continued)

FOREIGN PATENT DOCUMENTS

| | | |
|---|---|---|
| CN | 103236320 A | 8/2013 |
| JP | 2013208881 A | 10/2013 |

(Continued)

OTHER PUBLICATIONS

Lee et al., "High-Performance, Transparent, and Stretchable Electrodes Using Graphene-Metal Nanowire Hybrid Structures", Nano Letters, vol. 13, 2013, pp. 2814-2821.

(Continued)

*Primary Examiner* — Jeremy C Norris
(74) *Attorney, Agent, or Firm* — Cantor Colburn LLP

(57) ABSTRACT

A conductor includes a substrate, a first conductive layer disposed on the substrate and including two or more islands including graphene, and a second conductive layer disposed on the first conductive layer and including a conductive metal nanowire, wherein at least one of an upper surface and a lower surface of the islands including graphene includes a P-type dopant.

20 Claims, 26 Drawing Sheets

(51) Int. Cl.
*H05K 3/22* (2006.01)
*C01B 31/04* (2006.01)

(52) U.S. Cl.
CPC ........... *H05K 2201/0338* (2013.01); *H05K 2203/0783* (2013.01)

(56) References Cited

U.S. PATENT DOCUMENTS

| | | |
|---|---|---|
| 2003/0044608 A1 | 3/2003 | Yoshizawa et al. |
| 2011/0216020 A1 | 9/2011 | Lee et al. |
| 2012/0195821 A1 | 8/2012 | Sun et al. |
| 2012/0228110 A1 | 9/2012 | Takahashi et al. |
| 2012/0325296 A1 | 12/2012 | Woo et al. |
| 2013/0146846 A1* | 6/2013 | Adkisson .......... H01L 29/66045 257/27 |
| 2013/0255764 A1 | 10/2013 | Naito et al. |
| 2013/0319870 A1 | 12/2013 | Chen et al. |
| 2013/0330611 A1 | 12/2013 | Chen et al. |
| 2014/0087251 A1 | 3/2014 | Takahashi et al. |
| 2014/0127567 A1 | 5/2014 | Kuriki et al. |
| 2014/0141223 A1 | 5/2014 | Yoda et al. |
| 2014/0231718 A1 | 8/2014 | Lin et al. |
| 2014/0272172 A1 | 9/2014 | Zhamu et al. |
| 2014/0272199 A1 | 9/2014 | Lin et al. |
| 2014/0295179 A1 | 10/2014 | Naito et al. |
| 2014/0313562 A1 | 10/2014 | Ruoff et al. |
| 2014/0335312 A1 | 11/2014 | Suh et al. |
| 2015/0064574 A1 | 3/2015 | He et al. |
| 2015/0064628 A1 | 3/2015 | Guo |
| 2015/0155430 A1 | 6/2015 | Li |
| 2015/0168747 A1 | 6/2015 | Kadono et al. |
| 2015/0025725 A1 | 9/2015 | Naito et al. |
| 2015/0257258 A1 | 9/2015 | Naito et al. |
| 2015/0262724 A1 | 9/2015 | Naito et al. |
| 2015/0262747 A1 | 9/2015 | Oberle |
| 2015/0280207 A1 | 10/2015 | Chung et al. |
| 2015/0359065 A1 | 12/2015 | Park et al. |
| 2015/0364227 A1 | 12/2015 | Tai et al. |
| 2016/0027935 A1 | 1/2016 | Naito et al. |
| 2016/0365361 A1* | 12/2016 | Jiang ...................... H01L 21/77 |
| 2017/0133469 A1 | 5/2017 | Woo et al. |
| 2017/0188456 A1 | 6/2017 | Cho et al. |
| 2017/0194074 A1 | 7/2017 | Sohn et al. |
| 2017/0241039 A1 | 8/2017 | Takai |

FOREIGN PATENT DOCUMENTS

| | | |
|---|---|---|
| JP | 2014203929 A | 10/2014 |
| JP | 5737405 B2 | 6/2015 |
| KR | 101106629 B1 | 1/2012 |
| KR | 101148450 B1 | 5/2012 |
| KR | 1020130006868 A | 1/2013 |
| KR | 101284535 B1 | 7/2013 |
| KR | 1020140054553 A | 5/2014 |
| KR | 1020140075502 A | 6/2014 |
| KR | 1020140117894 A | 10/2014 |
| KR | 101479811 B1 | 12/2014 |
| KR | 101529382 B1 | 6/2015 |
| KR | 1020150078508 A | 7/2015 |
| KR | 1020150116238 A | 10/2015 |
| WO | 20140169853 A1 | 5/2014 |
| WO | 2015041388 A1 | 3/2015 |

OTHER PUBLICATIONS

Liu et al., "Doped graphene nanohole arrays for flexible transparent conductors", Applied Physics Letters, 99, 2011, 023111.

* cited by examiner

CONDUCTORS, MAKING METHOD OF THE SAME, AND ELECTRONIC DEVICES INCLUDING THE SAME

CROSS REFERENCE TO RELATED APPLICATIONS

This application claims priority to and the benefit of Korean Patent Application No. 10-2016-0031120 filed in the Korean Intellectual Property Office on Mar. 15, 2016, and all the benefits accruing therefrom under 35 U.S.C. §119, the entire content of which is incorporated herein by reference.

BACKGROUND

1. Field

A conductor, a method of making the conductor, and electronic devices including the same are disclosed.

2. Description of the Related Art

Electronic devices like flat panel display such as a liquid crystal display (LCD) or a light emitting diode (LED), a touch screen panel, a solar cell, or a transparent transistor, may include a transparent electrode. A material for a transparent electrode may have, for example, high light transmittance of greater than or equal to about 80 percent (%) and low specific resistance of less than or equal to about $1 \times 10^{-4}$ ohm-centimeter ($\Omega$cm) in a visible light region. The currently available materials may include an indium tin oxide (ITO), a tin oxide ($SnO_2$), a zinc oxide (ZnO), and the like. ITO is widely used as a transparent electrode material, and is a degenerate semiconductor having a wide bandgap of 3.75 electron volts (eV) that may be easily used to manufacture materials having a large surface area. However, the ITO may have limited conductivity and flexibility in terms of application to a flexible touch panel or a UD-level high resolution display, and also a high price due to limited reserves of indium.

Recently, a flexible electronic device has drawn attention as a next generation electronic device. Accordingly, there is a need to develop of a material with flexibility as well as having transparency and relatively high conductivity other than the above transparent electrode material.

SUMMARY

An embodiment provides a conductor having improved optical properties and mechanical flexibility, and high electrical conductivity and reliability.

Another embodiment provides a method of making the conductor.

Another embodiment provides an electronic device including the conductor.

According to an embodiment, a conductor includes: a substrate, a first conductive layer disposed on the substrate and including two or more islands including graphene, and a second conductive layer disposed on the first conductive layer and including a conductive metal nanowire, wherein at least one of an upper surface and a lower surface of the islands including graphene include a P-type dopant.

At least one island of the two or more islands including graphene may be a monolayer or a multilayer of ten or less layers.

A side surface of the islands including graphene may include the P-type dopant.

The upper surface, the lower surface, and a side surface of the islands including graphene may each include the P-type dopant.

The P-type dopant may include dichloro dicyano quinone, potassium monopersulfate triple salt, dimyristoyl phosphatidylinositol, benzimidazole, bis(trifluoromethanesulfonyl)amide (TFSA), bis(trifluoromethane)sulfonimide, N,N-di(1-naphthyl)-N,N-diphenylbenzidine (beta-NDP), 2,3,5,6-tetrafluoro-7,7,8,8-tetracyanoquinodimethane (F4-TCNQ), 7,8,8-tetracyanoquinodimethane (TCNQ), tetracyanoethylene (TONE), tetrakis(dimethylamino)ethylene (TDAE), anthracene (ANTR), melamine, 9,10-dibromoanthracene, 1,3,6,8-pyrenetetrasulfonic acid, polymethylmethacrylate, polyvinylidene difluoride (PVdF), poly(ethyleneoxide) (PEO), triazine, 1,5-naphthalenediamine, 9,10-dimethylanthracene, or a combination thereof.

The P-type dopant may include both a functional group capable of being adsorbed on the graphene and a hydrophilic group.

A work function of the P-type dopant may be greater than or equal to about 4.5 electron volts (eV).

The second conductive layer may include a nanowire mesh structure including a plurality of entangled conductive nanowires.

The conductor may further include an overcoat layer disposed on at least one upper surface of the second conductive layer.

The overcoat layer may be electrically connected to the substrate through the second conductive layer and the first conductive layer.

A sheet resistance of the conductor may be about 1 ohm per square (ohm/sq) to about 100 ohm/sq.

The substrate may include an oxide glass, a silica glass, a polyester, polyethylene terephthalate, polybutylene terephthalate, polyethylene naphthalate, polycarbonate, polyimide, an acryl polymer, cellulose, a cellulose derivative, polyimide, an organic/inorganic hybrid material, or a combination thereof.

The conductive metal nanowire may include silver (Ag), copper (Cu), gold (Au), aluminum (Al), cobalt (Co), palladium (Pd), or a combination thereof.

According to another embodiment, a method of making the conductor includes forming the first conductive layer including two or more islands including graphene, disposing the first conductive layer on a substrate, and forming a second conductive layer on the first conductive layer, wherein the second conductive layer comprises a conductive nanowire, wherein the method further comprises contacting an exposed surface of the two or more islands including graphene with a P-type dopant-containing solution to perform first P-doping on the exposed surface to form a first P-doped surface of the first conductive layer, and wherein the contacting is performed between the forming of the first conductive layer and the disposing of the first conductive layer on the substrate, or between the disposing of the first conductive layer on the substrate and the forming of the second conductive layer.

The first P-doping may be performed between the forming of the first conductive layer and the disposing of the first conductive layer on the substrate, and in the disposing of the first conductive layer on the substrate, the first P-doped surface of the first conductive layer surfaces is opposite to a surface of the substrate.

In the disposing of the first conductive layer on the substrate, an upper surface of the first conductive layer may be contacted with the P-type dopant-containing solution to perform a second P-doping.

The P-type dopant-containing solution may include a P-type dopant and an organic solvent, and the organic solvent may include an alcohol an ether, an alcohol ether, a ketone, an amide, a sulfoxide, a sulfone, a nitrile, an amine, an ester, a carboxylate ester, an aromatic hydrocarbon, an aliphatic hydrocarbon, a halogenated hydrocarbon, a carbonate, a nitro group-containing solvent, or a combination thereof.

The P-type dopant may be present at a concentration of less than or equal to about 0.5 milligrams per milliliter (mg/mL) based on a total volume of the P-type dopant-containing solution.

According to another embodiment, an electronic device includes the conductor.

The electronic device may be a flat panel display, a touch screen panel, a solar cell, an e-window, an electrochromic mirror, a heat mirror, a transparent transistor, or a flexible display.

BRIEF DESCRIPTION OF THE DRAWINGS

The above and other aspects, advantages and features of this disclosure will become more apparent by describing in further detail exemplary embodiments thereof with reference to the accompanying drawings, in which:

FIGS. 20 to 23 are enlarged SEM images (1,000 times) of a surface of Example 1, Example 2, Example 3, and Comparative Example 2, after performance of the tape evaluation, in which FIG. 20 shows Example 1, FIG. 21 shows Example 2; FIG. 22 shows Example 3; and FIG. 23 shows Comparative Example 2, FIG. 24 is an image before performing a bending evaluation, and FIG. 25 is an image after performing the bending evaluation.

FIG. 26 is an image before performing a bending evaluation, and FIG. 27 is an image after performing a bending evaluation.

DETAILED DESCRIPTION

Figure 1:
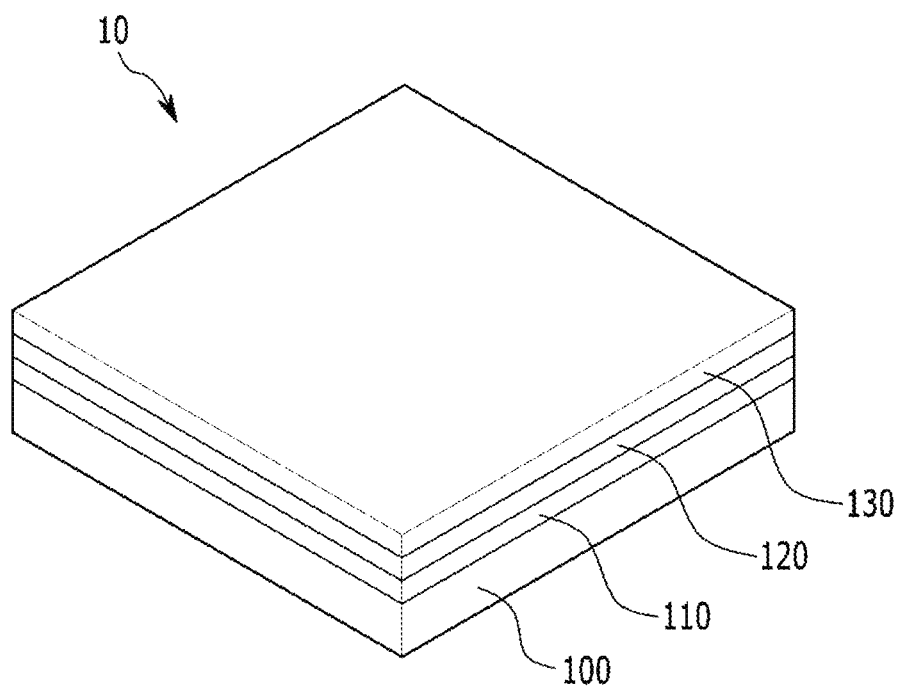
FIG. 1 is a schematic view showing a structure of a conductor according to an embodiment.

Advantages and characteristics of this disclosure, and a method for achieving the same, will become evident referring to the following exemplary embodiments together with the drawings attached hereto. However, this disclosure may be embodied in many different forms and is not be construed as limited to the embodiments set forth herein. In some embodiments, well-known process technologies are not explained in detail in order to avoid vague interpretation of the described technology.

If not defined otherwise, all terms (including technical and scientific terms) in the specification may be defined as commonly understood by one skilled in the art. The terms defined in a generally-used dictionary may not be interpreted ideally or exaggeratedly unless clearly defined.

As used herein, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when a first element such as a layer, film, region, or substrate is referred to as being "on" second element, the first element can be directly on the second element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the specification, the term "graphene" includes graphene in which carbon atoms repeatedly form hexagonal ring shapes, and the derivatives thereof, but for convenience, both of them are indicated by term "graphene."

Hereinafter, referring to FIG. 1, a schematic structure showing a conductor according to one embodiment is described.

FIG. 1 is a schematic view showing a structure of a conductor 10 according to an embodiment. Referring to FIG. 1, the conductor 10 according to an embodiment is a laminate structure including a substrate 100, a first conductive layer 110 disposed on the substrate 100 and including graphene, a second conductive layer 120 disposed on the first conductive layer 110 and including conductive metal nanowires, and an overcoat layer 130 disposed on the upper surface of second conductive layer 120.

The conductor 10 may have a structure in which a first conductive layer 110 is formed directly on a substrate 100, as shown in FIG. 1, and furthermore at least a second conductive layer 120 is formed directly on the first conductive layer 110. In other words, the conductor 10 according to an embodiment may have a structure that the first conductive layer 110 and the second conductive layer 120 including different conductive materials (graphene and conductive nanowire) from each other are sequentially stacked on the substrate 100 and hybridized. For example, the first conductive layer 110 includes graphene as a conductive material and the second conductive layer 120 includes a conductive nanowire as a conductive material.

The substrate 100 may be a transparent substrate. A material of the substrate 100 is not particularly limited, and may include a glass substrate, a semiconductor substrate, a polymer substrate, or a combination thereof, or may be a substrate including an insulation layer and/or a conductive layer laminated thereon. For example, the substrate 100 may include an inorganic material such as oxide glass, or a silica glass, a polymer such as polyester, polyethylene terephthalate, polybutylene terephthalate, polyethylene naphthalate, polycarbonate, polyimide, acryl polymer, cellulose, or a cellulose derivative and the like, an organic/inorganic hybrid material, or a combination thereof. The acryl polymer includes any polymer derived from polymerization of an acryl or a methacryl monomer, e.g., acrylonitrile, methacrylonitrile, acrylamide, methacrylamide, acrylic acid, methacrylic acid, or an ester of acrylic or methacrylic acid. Acryl polymers are preferred.

A thickness of substrate 100 is not particularly limited and may be desirably selected according to the kind of the resulting product. For example, the thickness of substrate 100 may be greater than or equal to about 0.5 micrometer (µm), for example greater than or equal to about 1 µm, or greater than or equal to about 10 µm, but is not limited thereto. The thickness of substrate 100 may be less than or equal to about 1 millimeter (mm), for example less than or equal to about 500 µm, or less than or equal to about 200 µm, but is not limited thereto. An additional layer (e.g., an undercoat layer) may be provided between the substrate 100 and the insulation layer and/or the conductive layer (e.g., for controlling a refractive index of transmitted light).

Figure 2A:
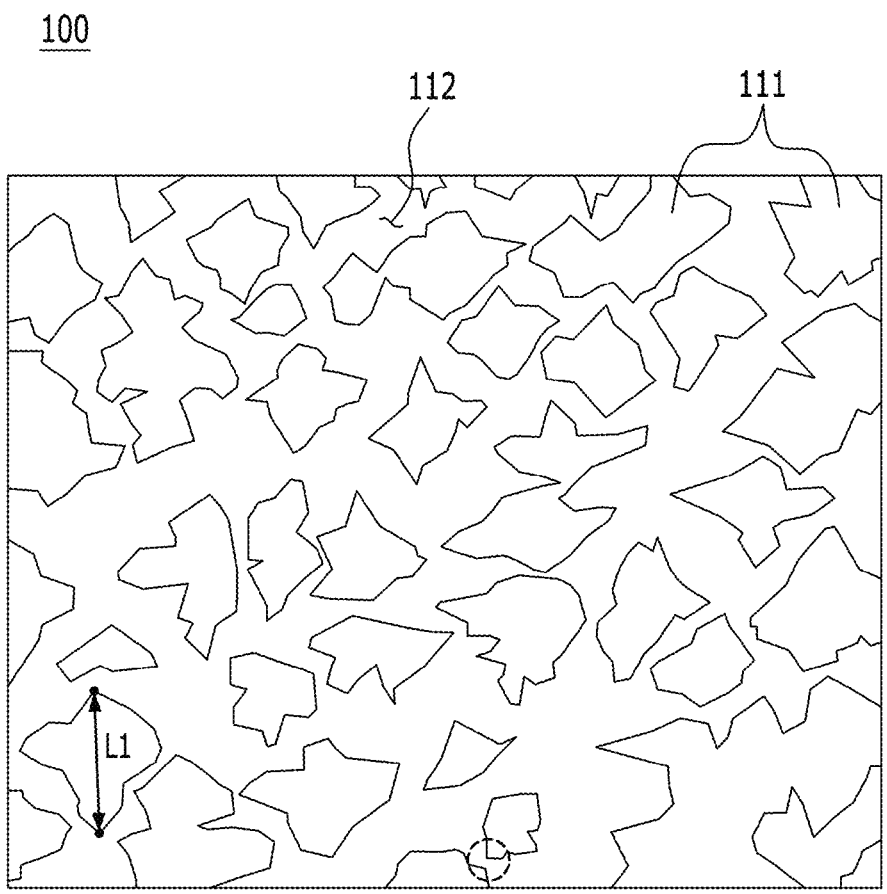
FIG. 2A shows a first conductive layer of a conductor according to an embodiment.
Figure 2B:
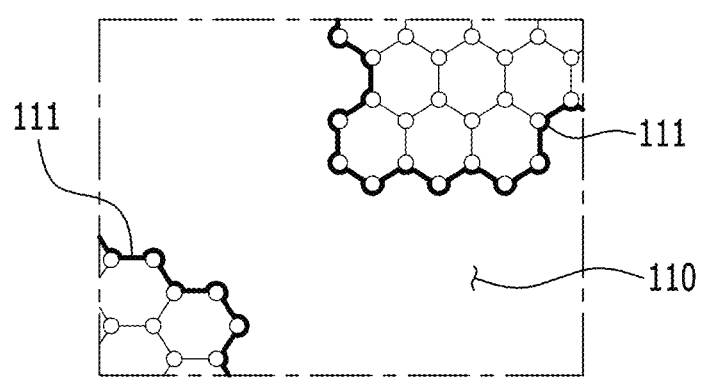
FIG. 2B is an expanded view of the circled portion in FIG. 2A.

FIGS. 2A and 2B show a first conductive layer of a conductor according to an embodiment.

Referring to FIGS. 1 and 2A and 2B, the first conductive layer 110 may be a layer disposed on the substrate 100 and including graphene. Also, the first conductive layer 110 of the conductor 10 according to an embodiment may include graphene, in particular, two or more island-shaped graphene 111 (e.g. islands of graphene) dispersed therein. In other words, the first conductive layer 110 may be divided into a region filled with two or more island-shaped graphene 111 and another region, referring to as an opening region 112, other than the space filled with the island-shaped graphene 111, as shown in FIG. 2.

In the first conductive layer 110, the island-shaped graphene 111 may block or absorb transmitted light. In other words, the island-shaped graphene 111 may cause an increase in the haze of the first conductive layer 110.

However, in the first conductive layer 110, the opening region 112 may facilitate transmittance of the transmitted light through the first conductive layer 110, so the overall light transmittance of the first conductive layer 110 may be increased in proportion to the area of the opening region 112. The light transmittance of the first conductive layer 110 itself may be controlled to be, for example, greater than or equal to about 99%.

For example, a graphene sheet including no opening region 112, unlike the above-described embodiment, has a light transmittance of around 95% to 97%, so it is beneficial to improve the light transmission characteristics. However, the first conductive layer 110 according to an embodiment, includes an island-shaped graphene 111, e.g. islands including graphene, and an opening region 112 instead of a graphene sheet covering an entire surface of the substrate, so a portion of the upper surface of substrate 100 is open to control the light transmittance within the desired range, thus it may provide a conductor 10 with excellent light characteristics.

Also, the island-shaped graphene 111 may be obtained by appropriately controlling the growing conditions of graphene during a process of forming the graphene, which will be described later in further detail.

The shape of the island-shaped graphene 111, as observed from the upper part of the substrate 100, may be a defined shape such as polygonal, circular, oval, or the like, an amorphous shape, or a combination thereof. In an embodiment, the island of graphene 111 may have the various shapes shown in FIG. 2.

The island-shaped graphene 111 may be a monolayer of graphene as shown in FIG. 2A, or a structure including a multilayer of less than or equal to 10 layers of graphene.

In the first conductive layer 110, two or more island-shaped graphene 111 may be dispersed, or at least two of island-shaped graphene are aggregated to each other to form one large island-shaped graphene structure.

In an embodiment, a first length (L1) is defined as a maximum length connecting any predetermined two points of the island-shaped graphene 111 disposed on the flat surface of substrate 100. The first length (L1) may be cited in the different ways according to the shape of island-shaped graphene 111, but it generally has a common definition. For example, when the island-shaped graphene 111 is circular, the first length is stated as a diameter; when the island-shaped graphene is oval or polygonal, the first length is stated as a long axis; or when the island-shaped graphene is amorphous, the first length may be referred to the longest distance among the distances connecting any two points.

For example, the first length (L1) may range from about 0.05 μm to about 100 μm. In other words, the island-shaped graphene 111 may have a wide range in size from several tens of nanometers to several hundreds of micrometers.

The first length (L1) may show the relatively wide range in distribution since individual island-shaped graphene have a different growing rate, and since the different island-shape graphene may be connected to form one large island structure, and the like.

However, when the first length (L1) is less than about 0.05 μm, the electrical conductivity of the first conductive layer 110 and the conductive metal nanowire which will be described later may be remarkably deteriorated, so as to deteriorate the reliability of conductor 10.

In addition, when the first length (L1) is greater than about 100 μm, the area occupied by the opening region 112 in the first conductive layer 110 is decreased, so that a haze of the first conductive layer 110 is increased, so as to deteriorate the light transmittance characteristics of conductor 10.

Also, the surface of island-shaped graphene may be P-doped by a P-type dopants. The effects of improving an electrical conductivity and an adhesion of the P-type dopant and the P-doped island-shaped graphene will be described later together with the disposition relationship of the second conductive layer 120 and the overcoat layer 130.

Figure 3:
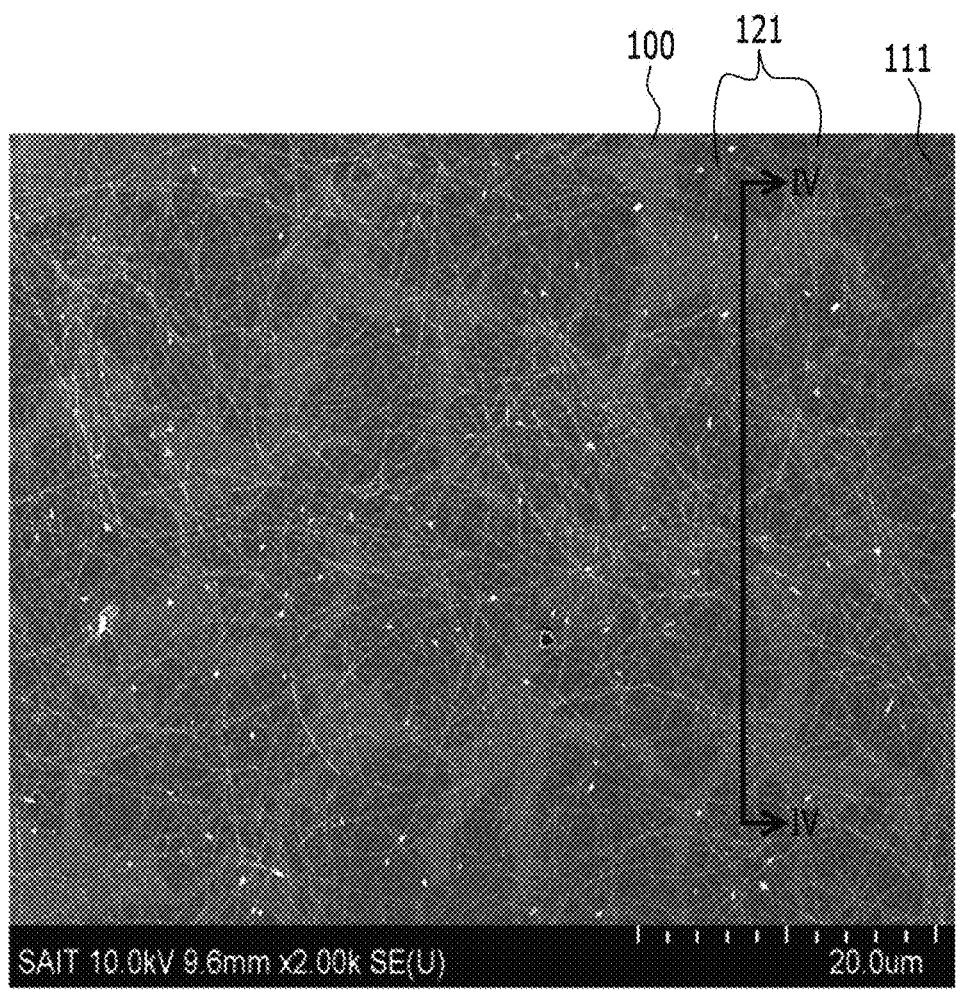
FIG. 3 is an scanning electron microscope (SEM) image of a structure of a conductor as observed from the upper side, according to an embodiment.

FIG. 3 is an SEM image showing a structure of the conductor according to an embodiment as observed from the upper surface of the conductor, which highlights that the first conductive layer 110 and the second conductive layer 120 are overlapped.

The upper surface of second conductive layer 120 may be covered with the overcoat layer 130 as shown in FIG. 1, but the overcoat layer 130 may be made of a transparent material, so it may be not distinguished from the first conductive layer 110 and the second conductive layer 120 upon observation with the naked eye. FIG. 3 will be described omitting the composition of the overcoat layer 130.

In FIG. 3, the island-shaped graphene 111 is shown as the darker part, and the brighter part around the darker part is defined by the opening region, so a portion of the upper surface of substrate 100 is exposed.

Referring to FIGS. 1 and 3, the second conductive layer 120 includes greater than or equal to two conductive metal nanowires 121 disposed directly on the first conductive layer 110. In the second conductive layer 120, the conductive metal nanowires 121 may be in contact with each other to provide an electrical connection therebetween. A mesh-shaped structure is formed by entangling the contacted conductive metal nanowires 121 with each other, and due to the mesh-shaped structure, the electrical conductivity of the second conductive layer 120 may be further improved.

Figure 4:
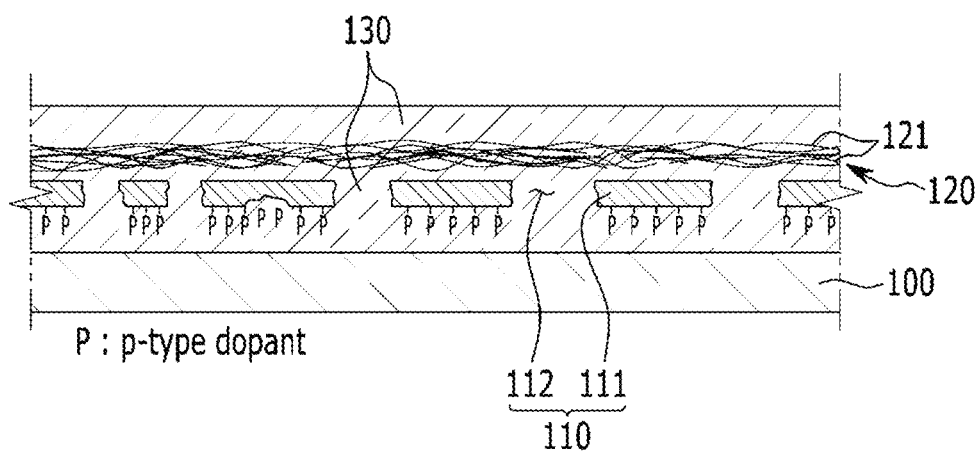
FIG. 4 is schematic view of a cross-section of the conductor in FIG. 3 taken along line IV-IV, according to an embodiment.
Figure 5:
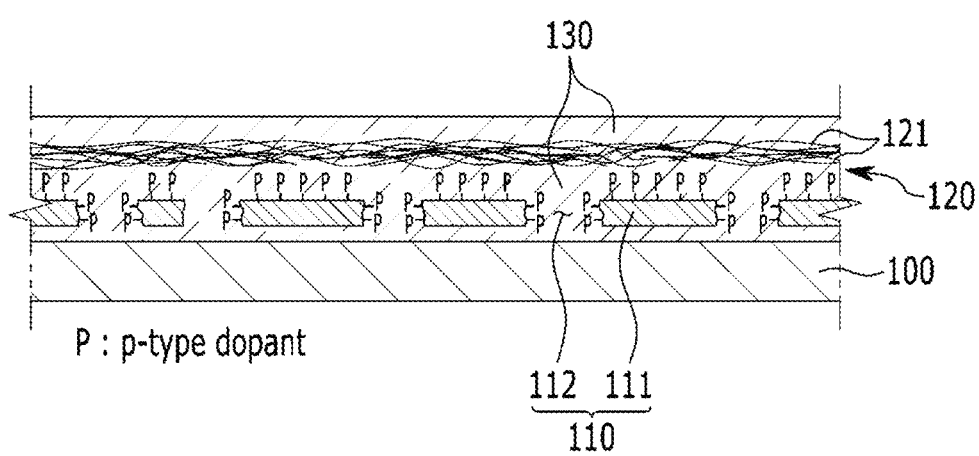
FIG. 5 is schematic view of a cross-section of FIG. 3 cut along line IV-IV, according to another embodiment.

That is, the obtained second conductive layer 120 may include a nanowire mesh structure including a plurality of conductive metal nanowires 121, as shown in FIGS. 4 and 5.

The nanowire mesh structure includes space where the entangled conductive metal nanowires 121 are in contact with each other and pore space where the conductive metal nanowires 121 are not in contact with each other. In an embodiment, the conductive metal nanowires 121 are randomly entangled without being aligned in a certain direction, as shown in FIG. 3, to provide a nanowire mesh structure.

Also, the conductive metal nanowires 121 may be formed of a metallic material having electrical conductivity, including for example, silver (Ag), copper (Cu), gold (Au), aluminum (Al), cobalt (Co), palladium (Pd), an alloy thereof, or a combination thereof (e.g., the conductive metal nanowires 121 having two or more differing segments). For example, the conductive metal nanowires 121 may be silver (Ag) nanowires.

The conductive nanowire 121 may have an average diameter of less than or equal to about 100 nm, for example, less than or equal to about 30 nm or less than or equal to about 20 nm. A length of the conductive nanowire 121 is not particularly limited and may be desirably adjusted depending on a diameter thereof. For example, the length of the conductive metal nanowires 121 may be greater than or equal to about 10 µm, for example greater than or equal to about 20 µm, or greater than or equal to about 30 µm, but is not limited thereto.

The conductive metal nanowire 121 may be manufactured by a known method or may be commercially available. Polymers such as polyvinylpyrrolidone may be optionally coated on a surface of the conductive metal nanowire 121.

The second conductive layer 120 may be formed by a known layer forming method, and is not particularly limited. In non-limiting examples, the second conductive layer 120 may be formed by applying a coating composition including the conductive nanowire 121 and a solvent (e.g., water, an organic solvent that is miscible or immiscible with water) directly on the first conductive layer 110, and then removing the solvent. The coating composition may further include a dispersant (e.g., hydroxypropyl methylcellulose (HPMC), or a C2 to C20 organic acid).

For example, the coating composition including the conductive nanowire 121 may be commercially available or may be formed by a known method.

A structure in which the conductive nanowires 121 form a series of layers may be provided by coating the coating composition on a substrate and then optionally drying and/or heat treating the coating composition. The coating composition may be coated on the substrate by various methods, including, e.g., bar coating, blade coating, slot die coating, spray coating, spin coating, Gravure coating, ink jet printing, or a combination thereof.

Also, the second conductive layer 120 may further include an organic binder. The organic binder may serve to desirably adjust a viscosity of the coating composition used to form the second conductive layer 120, or may serve to improve a binding force between the nanowires, or may improve an adherence between the first conductive layer 110 and the second conductive layer 120. Non-limiting examples of the organic binder may include methyl cellulose, ethyl cellulose, hydroxypropyl methyl cellulose (HPMC), hydroxypropyl cellulose (HPC), a xanthan gum, polyvinyl alcohol (PVA), polyvinylpyrrolidone (PVP), carboxylmethyl cellulose, hydroxyethyl cellulose, or a combination thereof. An amount of the binder may be desirably selected by the skilled person without undue experimentation, and is not particularly limited. For example, the content of the organic binder may be in a range of about 1 part by weight to about 100 parts by weight, with respect to 100 parts by weight of the conductive metal nanowires.

Much research has been made to apply graphene as a material for a highly flexible transparent conductive layer in order to replace indium tin oxide (ITO) that has unfavorable mechanical characteristics. However, since graphene has a relatively high light absorption coefficient, it is difficult to achieve satisfactory light transmittance. The graphene is difficult to use, when stacked separately to have a thickness of four or more sheets of graphene monolayers.

Also, a flexible conductor including the conductive metal nanowires 121 has been being developed, but such conductive nanowires 121 have low break elongation. Accordingly, the metal nanowires may be broken when placed under a high tensile strain, so their application in a flexible electrode is limited.

In other words, the conductive metal nanowires 121 may be capable of achieving a low sheet resistance and an improved light transmittance, but they may also be readily broken under a high tensile strain (e.g., about 6.7% or greater) resulting in remarkable decrease in reliability. Graphene may provide an improved flexibility, but tends to show a high sheet resistance relative to a light transmittance.

However, the conductor 10 according to an embodiment may have a hybridized structure in which heterogeneous conductive layers are stacked by forming a second conductive layer 120 including a nanowire mesh structure in which a plurality of conductive metal nanowires 121 are entangled so as to be both physically and electrically connected to each other, on the first conductive layer 110 including two or more island-shaped graphene 111 consisting of graphene.

In an embodiment, without being limited by theory, it is believed that when the first conductive layer 110 has a structure in which two or more island-shaped graphene 111 are dispersed, instead of a general graphene sheet, the haze characteristics of the first conductive layer 110 may be improved through the open space defined by the opening region 112.

In addition, by hybridizing the conductive metal nanowires 121 and the island-shaped graphene 111, the conductor 10 may have excellent mechanical flexibility even in the high tensile strain region (e.g., a strain of greater than or equal to about 6.7%), and the conductor 10 have properties that rarely change even if a portion of the conductive metal nanowires 121 is broken due to repeated physical impact, or the like. That is, the conductor 10 has a high reliability.

In addition, according to an embodiment, by providing a second conductive including a conductive metal nanowire 121 mesh structure on the first conductive layer 110, the sheet resistance of first conductive layer 110 may be decreased, so as to improve the electrical conductivity of the hybridized conductor 10.

FIG. 4 is a schematic view showing a cross-section taken along line IV-IV of FIG. 3.

Referring to FIGS. 1 and 4, the conductor 10 according to an embodiment may include an overcoat layer 130 disposed on the second conductive layer 120 and including a thermosetting resin, an ultraviolet (UV) light curable resin, or a combination thereof.

Since the overcoat layer 130 is made of a transparent material, the light sequentially transmitted through the substrate 100, the first conductive layer 110, and the second conductive layer 120 may be emitted by being transmitted through the overcoat layer 130, or the light entering through the overcoat layer 130 may be transmitted in a direction towards the substrate 100.

Specific examples of a thermosetting resin and an ultraviolet (UV) light curable resin for forming the overcoat layer 130 are known to those of skill in the art.

In an embodiment, the thermosetting resin and ultraviolet (UV) light curable resin for forming the overcoat layer 130 may include a polymer resin including urethane methacrylate, a perfluoropolymer having a (meth)acrylate group, a polymethacrylate having a (meth)acrylate group, epoxy methacrylate, or a combination thereof. A (meth)acrylate group is inclusive of an acrylate ($H_2C=CH-C(=O)O-$) group or a methacrylate group ($H_2C=C(CH_3)-C(=O)O-$).

The overcoat layer 130 may further include an inorganic oxide particulate (e.g., a silica particulate). Any suitable method for forming an overcoat layer on the conductive layer using these materials may be used and is not particularly limited.

Referring to FIG. 1, the overcoat layer 130 may be physically connected with an upper surface of the substrate 100 through the second conductive layer 120 and the first conductive layer 110. In other words, in an embodiment, the overcoat layer 130 may be connected to the upper surface of substrate 100 by permeating the polymer resin of the overcoat layer into the first conductive layer 110 through pores formed in the nanowire mesh structure during the coating process; and filling a portion of the opening region 112 formed in the first conductive layer with the permeated polymer resin.

Generally, graphene has rather weak adhesion with other adjacent layers when forming a laminated structure including graphene due to its chemical instability. Graphene is generally hydrophobic while the substrate or the overcoat layer is generally hydrophilic, and the adhesion between graphene and the substrate or between graphene and the overcoat layer may be weak. Thus in the case of the laminate structure in which graphene is interposed between the substrate and the overcoat layer, the overcoat layer may come off or be delaminated from the substrate by repeated or temporally physical impacts such as bending, or during the manufacturing process. When the overcoat layer comes off or is delaminated, the sheet resistance of the first conductive layer and the second conductive layer increases, thereby affecting the reliability of the conductor and the electronic device including the same.

However, according to an embodiment, since the overcoat layer 130 is formed not only on the upper surface of second conductive layer 120, but also permeates the spaces amongst the plurality of conductive metal nanowires 121 of the second conductive layer 120 and amongst the plurality of opening regions 112 defined in the first conductive layer 110, as shown in FIG. 5, the overcoat layer 130 may be directly physically connected to the upper surface of substrate 100. Thereby, the adhesion between the overcoat layer 130 and the substrate 100, and between the first conductive layer 110 and the second conductive layer 120, may be improved. In other words, according to an embodiment, the overcoat layer 130 may be capable of minimizing the deterioration of electrical conductivity characteristics in the conductor 10 even when the conductor 10 is subjected to repeated or temporal physical impacts such as bending.

Figure 6:
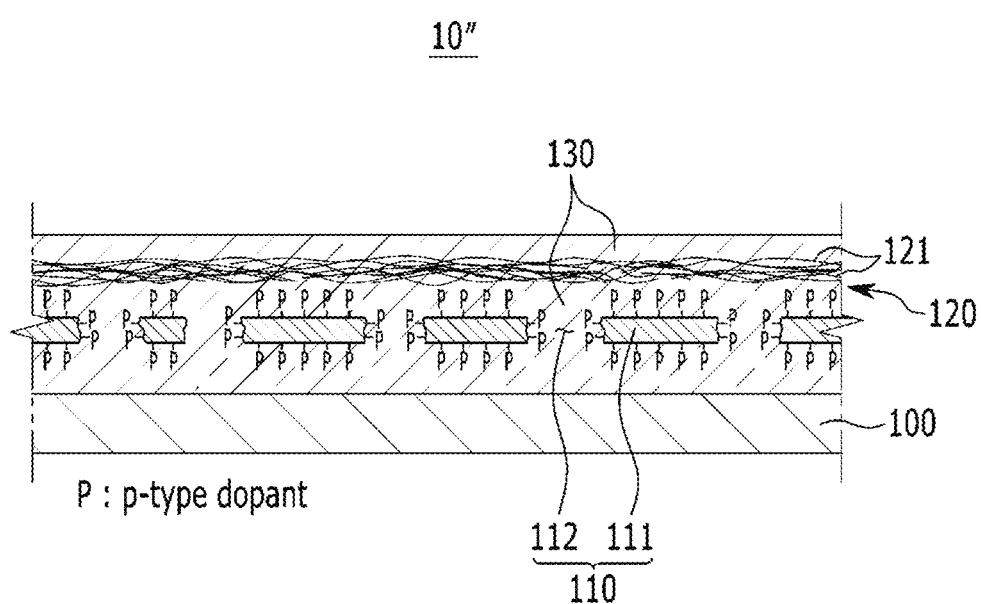
FIG. 6 is schematic view of a cross-section of FIG. 3 cut along line IV-IV, according to yet another embodiment.

FIG. 5 shows another example of FIG. 4; and FIG. 6 shows further another example of FIG. 4.

Also, in an embodiment, the surface of island-shaped graphene 111 may be P-doped by adsorbing a P-type dopant thereon. For example, the upper surface or the lower surface of island-shaped graphene 111 may be P-doped with a P-type dopant. In other words, the lower surface of island-shaped graphene 111 may include the P-type dopant as shown in FIG. 4. However, an embodiment is not limited thereto, and alternatively, the upper surface of island-shaped graphene 111 may be include the P-type dopant (referring to FIG. 5), the side surfaces of island-shaped graphene 111 may include the P-type dopant (referring to FIGS. 5 and 6), or all of the upper surface, the lower surface, and side surfaces of the island-shaped graphene 111 may include the P-type dopant (referring to FIG. 6).

The P-type dopant may be an organic material, such as a low molecular weight oligomer or polymer including a functional group capable of being adsorption-doped on the graphene and a hydrophilic group. The P-type dopant may include, for example dichlorodicyanoquinone, Oxone® (potassium monopersulfate triple salt), dimyristoyl phosphatidylinositol, benzimidazole, bis(trifluoromethane)sulfonylamide (TFSA), bis(trifluoromethane)sulfonimide, N,N-di(1-naphthyl)-N,N-diphenylbenzidine (beta-NDP), 2,3,5,6-tetrafluoro-7,7,8,8-tetracyanoquinodimethane (F4-TCNQ), 7,8,8-tetracyanoquinodimethane (TCNQ), tetracyanoethylene (TONE), tetrakis(dimethylamino)ethylene (TDAE), anthracene (ANTR), melamine, 9,10-dibromoanthracene, 1,3,6,8-pyrenetetrasulfonic acid, polymethylmethacrylate, polyvinylidene difluoride (PVdF), modified polyvinylidene difluoride, poly(ethyleneoxide) (PEO), triazine, 1,5-naphthalenediamine, 9,10-dimethylanthracene, or a combination thereof.

As the P-type dopant acts an electron donor on the surface of the island-shaped graphene 111, the electrical conductivity of island-shaped graphene 111 may be improved.

Also, the P-type dopant according to an embodiment may be an organic dopant having both a hydrophilic group and a hydrophobic group. Hereinafter, the method by which the adhesion is improved by the organic dopant having both a hydrophilic group and a hydrophobic group is explained with reference to FIGS. 4 to 6 and FIG. 7.

Figure 7:
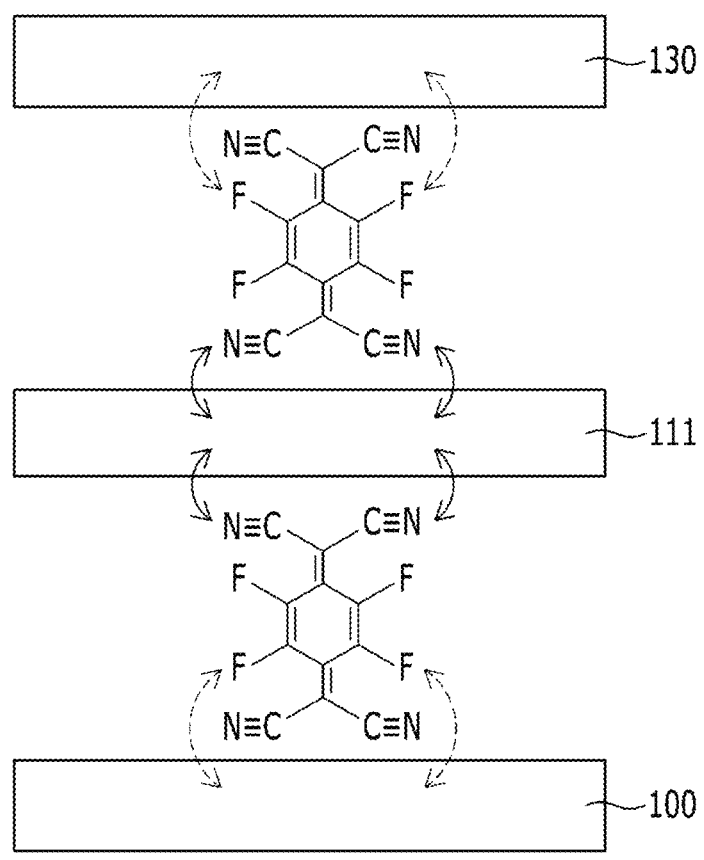
FIG. 7 schematically shows an interaction between the P-type dopant shown in FIGS. 4 to 6 and a substrate, an island-shaped graphene, and an overcoat layer respectively.

FIG. 7 schematically shows an interaction between the P-type dopant disposed as shown in FIGS. 4 to 6, and a substrate, an island-shaped graphene, and an overcoat layer. In particular, FIG. 7 illustrates a protocol of using a P-type dopant such as 2,3,5,6-tetrafluoro-7,7,8,8-tetracyanoquinodimethane (F4-TCNQ) as an example, but is not limited thereto, and the stated various organic dopants or a combination thereof may be alternatively used.

In the P-type dopant, a functional group ("—CN" group in FIG. 7) for graphene adsorption-doping is adsorbed on the surface of island-shaped graphene 111 to perform a charge transfer. Thereby, the adsorption energy between the functional group for the graphene adsorption-doping and the island-shaped graphene 111 is increased, so the P-type dopant is more stably adsorbed into the island-shaped graphene 111, and also functions as an electron donor, so as to improve the electrical conductivity of the conductor 10.

In an embodiment, the work function of P-type dopant may be, for example, greater than or equal to about 4.2 eV, for example, greater than or equal to about 4.5 eV, for example, greater than or equal to about 4.52 eV, in order to improve both the absorption energy of the island-shaped graphene 111 and electron-donating function.

In an embodiment, sheet resistance of the conductor 10 may be, for example about 1 ohm/sq to about 100 ohm/sq, for example about 10 ohm/sq to about 80 ohm/sq, for example about 10 ohm/sq to about 50 ohm/sq, for example about 10 ohm/sq to about 30 ohm/sq. When the sheet resistance of conductor 10 is decreased to fall within the above ranges, it may provide a conductor 10 with an excellent electrical conductivity.

Also, among P-type dopants, the hydrophilic group (e.g. "—F" group in FIG. 7) forms a molecular interaction with the substrate 100 or the overcoat layer 130, which is a hydrophilic material.

In other words, a van der Waals force may be at work between the hydrophilic group and the substrate 100, or between the hydrophilic group and the overcoat layer 130, so the layers may hardly come off or be delaminated from the substrate by the repeated or temporal physical impact such as bending even if the hydrophobic island-shaped graphene 111 is interposed between the hydrophilic substrate and the overcoat layer.

In this viewing point, in the case of FIG. 4, the P-type dopant may generally improve adhesion between the surface of island-shaped graphene 111 and the substrate 100; in the case of FIG. 5, the P-type dopant may improve adhesion between the overcoat layer 130 in contact with the side surfaces and the upper surface of island-shaped graphene 111; and in the case of FIG. 6, the P-type dopant may improve adhesion between the substrate 100 and the overcoat layer 130.

In order to improve adhesion between graphene and the substrate, or between graphene and the overcoat layer, an additional adhesive layer may be disposed between graphene and the substrate, or between graphene and the overcoat layer. However, the adhesive layer may effectively deteriorate the optical properties (light transmittance, haze) and the electrical conductivity of the graphene-conductive metal nanowire hybridized structure due to the material of the adhesive layer and due to an increased entire thickness of the conductor.

However, according to an embodiment, since the surface of island-shaped graphene 111 includes P-type dopants, which provide an excellent electrical conductivity due to the charge transfer, and also improve adhesion between the island-shaped graphene 111 and the substrate 100 and/or the overcoat layer 130, the provided conductor 10 may have excellent electrical conductivity and reliability by modifying the surface of island-shaped graphene 111 using the P-type dopant, and without including an additional adhesive layer.

In an embodiment, the light transmittance of conductor 10 may be, for example, greater than or equal to about 85%, for example, greater than or equal to about 88%, for example, greater than or equal to about 89.5%, for example, or about 89.5% to about 92.5%. In an embodiment, the light transmittance of conductor 10 is a value including the light absorption of substrate 100, for example, it is a value when a PET substrate having a light transmittance of 92.5%, is used as the substrate 100.

Also, in an embodiment, the haze of conductor 10 may be, for example, less than or equal to about 2%, for example, less than or equal to about 1.8%, for example, less than or equal to about 1.5%, or for example, less than or equal to about 1.4%.

In other words, as the conductor 10 according to an embodiment shows optically excellent light transmittance and haze characteristics, it may be employed for the various display devices, a window, a transparent electrode of mirror, a transparent sensor, and the like.

In another embodiment, an electronic device includes the conductor 10.

The electronic device may be a flat panel display, a curved panel display, a touch screen panel, a solar cell, an e-window, an electrochromic mirror, a heat mirror, a transparent transistor, a flexible display, a flexible touch screen panel, a flexible solar cell, a flexible e-window, a flexible electrochromic mirror, or a flexible heat mirror.

Figure 8:
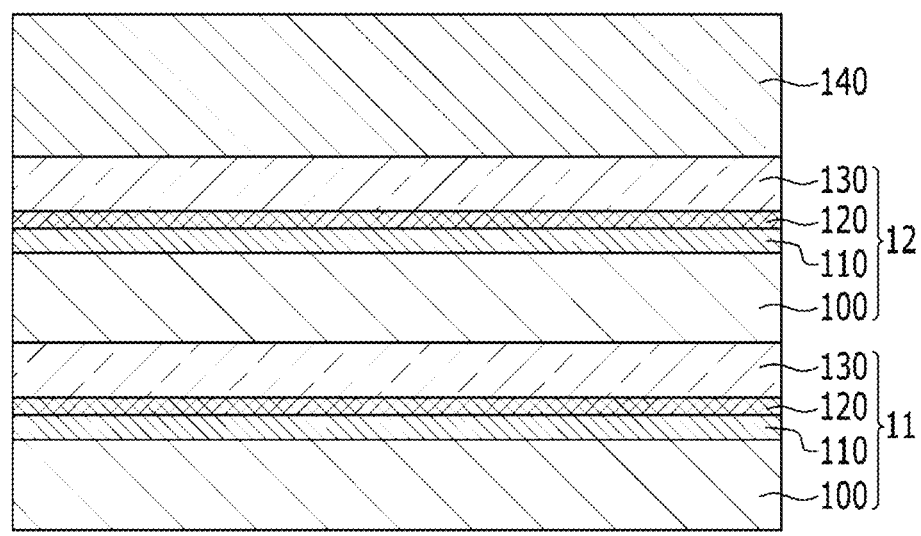
FIG. 8 is a schematic view showing a structure of an electronic device (touch screen panel) including a conductor according to an embodiment.

FIG. 8 is a schematic view showing a structure of an electronic device (touch screen panel) including the conductor according to an embodiment.

As shown in FIG. 8, a touch screen panel as an example of the electronic device 20 includes a first conductor 11 including a substrate 100, a first conductive layer 110, a second conductive layer 120, and an overcoat layer 130 which are stacked sequentially, a second conductor 12 having the same stacked layers as the first conductor 11 and being disposed directly on the first conductor 11, and a cover window 140 on the second conductor 12.

In FIG. 8, an example of applying the conductor to a transparent electrode of a touch screen panel (e.g., TSP) is illustrated, but the conductor may be used as an electrode for other electronic devices including a transparent electrode, without a particular limit. For example, the conductor may be applied as a pixel electrode and/or a common electrode for a liquid crystal display (LCD), an anode and/or a cathode for an organic light emitting diode device, or a display electrode for a plasma display device.

Hereinafter, a method of making the conductor is described.

A method of making a conductor according to an embodiment includes forming a first conductive layer including two or more island-shaped graphene (e.g. islands including graphene), disposing the first conductive layer on the substrate, and forming the second conductive layer on the first conductive layer.

Herein, an exposed surface of the two or more island-shaped graphene are contacted with a P-type dopant-containing solution to perform a first P-doping on the exposed surface between the forming of the first conductive layer and the disposing of the first conductive layer on the substrate, or between the disposing of the first conductive layer on the substrate and the forming of the second conductive layer. Thereby, the specific position of the P-type dopant on the first P-doped island-shaped graphene may be changed, and additional details will be described in follows with reference to FIGS. 9 and 10.

Figure 9:
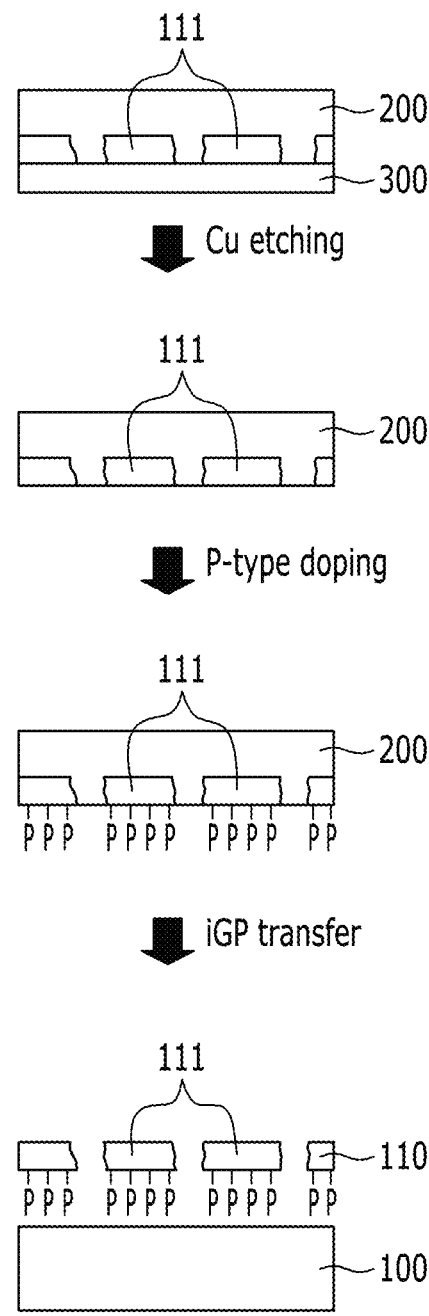
FIG. 9 is a flow chart showing a method of P-doping only a lower surface of an island-shaped graphene in a method of making the conductor according to an embodiment.
Figure 10:
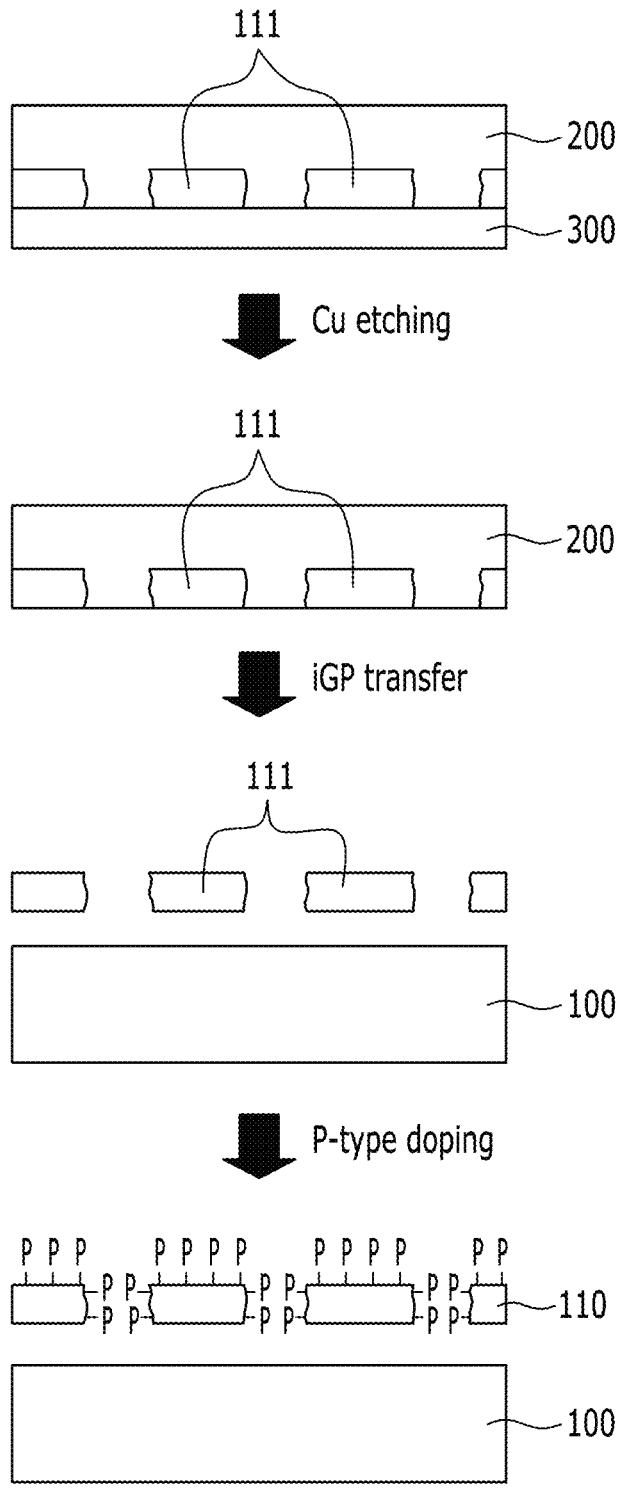
FIG. 10 is a flowchart showing a method of P-doping an upper surface and side surfaces of an island-shaped graphene in a method of producing a conductor according to an embodiment.

FIG. 9 is a flowchart showing a method of P-doping only the lower surface of island-shaped graphene in the method of making a conductor according to an embodiment; FIG. 10 is a flowchart showing a method of P-doping the upper surface and side surfaces of island-shaped graphene in the method of making a conductor according to an embodiment.

Referring to FIGS. 9 and 10, in the first conductive layer forming process, firstly according to the known method, an island-shaped graphene (iGP) 111 layer is grown on a metal substrate 300 (e.g. Cu substrate) and attached with a release film 200 (e.g. PMMA), then the metal substrate 300 is removed by a metal etching process to provide a laminate structure of release film 200/island-shaped graphene 111.

In example embodiments, the metal substrate may be, for example a copper (Cu) substrate, but is not limited thereto, and may include Cu, Ni, Co, Fe, Pt, Au, Ru, Al, Cr, Mg, Mn, Mo, Rh, Si, Ta, Ti, W, U, V, Zr, brass, bronze, white brass, stainless steel, Ge, an alloy thereof, or a combination thereof.

The layer of island-shaped graphene 111 on the metal substrate 300 is formed by thermal decomposition deposition or a chemical vapor deposition (CVD) processes on at least one side of the metal substrate 300. For example, a rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD), or plasma-enhanced chemical vapor deposition (PECVD), and the like, may be used without limitation. The desirable conditions for each process may be determined by one of ordinary skill in the art without undue experimentation.

The deposition of the island-shaped graphene 111 on the metal substrate 300 may be performed at a temperature from 300° C. to a temperature of below the melting point of the metal substrate, and at a pressure from about $1.3 \times 10^{-8}$ Pascal (Pa) to atmospheric pressure. As shown in FIGS. 9 and 10, a release film 200 attached on the island-shaped graphene 111 may be, for example a poly(methylmethacrylate) (PMMA), but is not limited thereto, and the release film 200 may include a polymer such as poly(methylmethacrylate) (PMMA), polyethylene terephthalate, polyimide, polyethylene naphthalate, or polycarbonate, an inorganic material such as glass, a silicon wafer, a porous organic/inorganic membrane, a metal organic frame, a thermally peeling tape, an ion exchange film, or a membrane electrode. The laminate structure may be formed by a roll-to-roll process.

For example, a release film 200 is stacked on the metal substrate/-island-shaped graphene and passed through one or more roller or, if desired, a roller member including greater than or equal to 2 rollers facing to each other, to provide a laminate structure.

When the laminate structure is obtained by the roll-to-roll process, a polymer binder film may be further formed between the metal substrate/-island-shaped graphene layer and the release film 200 to stack the release film 200 on the metal substrate 300/-island-shaped graphene 111 layer. The polymer binder film may include, for example, poly(methylmethacrylate), polystyrene, polyethylene, glycol, polyvinylpyrrolidone, Nafion™, sodium poly(acrylate), poly(diallyldimethyl ammonium chloride), and polyethyleneimine. The roller member may be also used to provide the polymer binder film.

The heat treatment may be, for example performed at a temperature of about 60° C. to about 200° C., specifically, at a temperature of about 120° C. to about 160° C. Within the temperature range, the bond between the island-shaped graphene 111 and the release film 200 may be enhanced by the heat treatment.

In an embodiment, the P-doping method may be a wet doping using the P-type dopant-containing solution. Thereby, as described above, a charge is exchanged between the P-type dopant and the surface of the island-shaped graphene to be doped. During the surface charge doping, an electron or hole is localized on the surface to build up an electrostatic potential. Thereby, movement of the charge may be blocked in a vertical direction but may be freely transported in a direction parallel to the surface.

In an embodiment, the P-type dopant-containing solution is contacted with the surface of the island-shaped graphene 111 to perform P-doping. Herein the P-type dopant-containing solution may include the P-type dopant and an organic solvent. The organic solvent may include a hydrophobic solvent, a hydrophilic solvent, or a combination thereof.

The organic solvent may include, for example, an alcohol solvent selected from methanol, ethanol, propanol, isopropanol, butanol, and isobutanol; an ether solvent selected from diethyl ether, dipropyl ether, dibutyl ether, butylethyl ether, and tetrahydrofuran; an alcohol ether solvent selected from ethylene glycol, propylene glycol, ethylene glycol monomethyl ether, ethylene glycolmonoethyl ether, and ethylene glycol monobutyl ether; a ketone solvent selected from acetone, methylethyl ketone, methylisobutyl ketone, and cyclohexanone; an amide solvent selected from N-methyl-2-pyrylidinone, 2-pyrylidinone, N-methylformamide, and N,N-dimethyl formamide; a sulfoxide solvent selected from dimethylsulfoxide and diethylsulfoxide; a sulfone solvent selected from diethyl sulfone and tetramethylene sulfone; a nitrile solvent selected from acetonitrile and benzonitrile; an amine solvent selected from a C1 to C10 alkylamine, a C4 to C12 cyclic amine, and a C5 to C20 aromatic amine; an ester solvent selected from methyl butyrate, ethyl butyrate, and propyl propionate; a carboxylate ester solvent selected from ethyl acetate, and butyl acetate; an aromatic hydrocarbon solvent selected from benzene, ethylbenzene, chlorobenzene, toluene, and xylene; an aliphatic hydrocarbon solvent selected from hexane, heptane, and cyclohexane; a halogenated hydrocarbon solvent selected from chloroform, tetrachloroethylene, carbon tetrachloride, dichloromethane, and dichloroethane; propylene carbonate; ethylene carbonate, dimethyl carbonate, dibutyl carbonate, ethylmethyl carbonate, an dibutyl carbonate; a nitro group-containing solvent selected from nitromethane, nitroethane, and nitrobenzene; or a combination thereof.

In an embodiment, the alcohol solvent may be present in an amount of, for example, greater than or equal to about 5 volume %, for example, greater than or equal to about 20 volume %, based on the total volume of solvent. In other words, when an alcohol solvent including both a hydrophilic group (—OH group) and a hydrophobic group (—CH group) is included in greater than or equal to about 10 volume %, the wettability of the P-type dopant-containing solution on the surface of island-shaped graphene is improved to thereby facilitate the adsorption of P-type dopant.

Also, in an embodiment, the P-type dopant may be present in an amount of, for example, less than or equal to about 2.0 mg/mL, for example, less than or equal to about 1.0 mg/mL, for example, less than or equal to about 0.5 mg/mL, for example, less than or equal to about 0.2 mg/mL, for example, about 0.1 mg/mL to 0.2 mg/mL, based on the total volume of the P-type dopant-containing solution.

When the concentration of P-type dopant is adjusted to fall within the above range, the P-type dopant may be easily adsorbed onto the surface of island-shaped graphene, and also adherence between the P-type dopant and the substrate/overcoat layer may be maximized.

Hereinafter, referring to FIG. 9, in the obtained release film/-island-shaped graphene laminate structure, the exposed surface of island-shaped graphene 111 is contacted with the P-type dopant-containing solution to perform a first P-doping step; the first conductive layer including the release film/-island-shaped graphene laminate structure and first P-doped surface is disposed so that the first P-doped surface is disposed facing a substrate 100 surface; transferring the same onto the substrate 100; delaminating the release film 200 to provide a laminated structure of a substrate/P-doped first conductive layer in which the first conductive layer including island-shaped graphene including a P-dopant is formed on the substrate.

On the other hand, referring to FIG. 10, unlike FIG. 9, the obtained laminate structure of release film/island-shaped graphene is transferred onto a substrate 100, the release film 200 is removed, and then, in the obtained substrate/P-doped first conductive layer, the exposed surfaces of island-shaped graphene 111 are contacted with the P-type dopant-containing solution to perform a first P-doping step.

The removing of the release film 200 may be desirably performed according to the composition of the release film, but is not particularly limited. For example, the release film 200 may be removed using a solvent such as ethanol or tape (e.g. adhesive tape having desirable adherence is applied and then removed), but is not limited thereto.

Each laminate structure of substrate/P-doped first conductive layer obtained from FIGS. 9 and 10 may have the P-type dopant attached to the island-shaped graphene 111 in different specific positions. In other words, in the case of FIG. 9, P-type dopant is adsorbed on the lower surface which is the only exposed part in the island-shape graphene due to a presence of release film.

On the other hand, in the case of FIG. 10, since all the other regions (upper surface and sides) of island-shaped graphene 111 transferred onto the substrate 100 are exposed, except the lower surface in contact with the substrate 100, the P-type dopant may be adsorbed onto all of the upper surface and side surfaces of island-shaped graphene 111.

In an embodiment, in order to improve adherence between the generally hydrophilic substrate and the overcoat layer, the subsequent process of preparing the conductor will be further described based upon the laminate structure of substrate/P-doped first conductive layer formed through the process illustrated in FIG. 9. However, an embodiment is not limited thereto, and the processes of FIGS. 9 and 10 may be changed according to the hydrophobicity of the substrate and/or the following overcoat layer, the usage, the size, and the circumference of the electronic device to be employed with the conductor.

Figure 11:
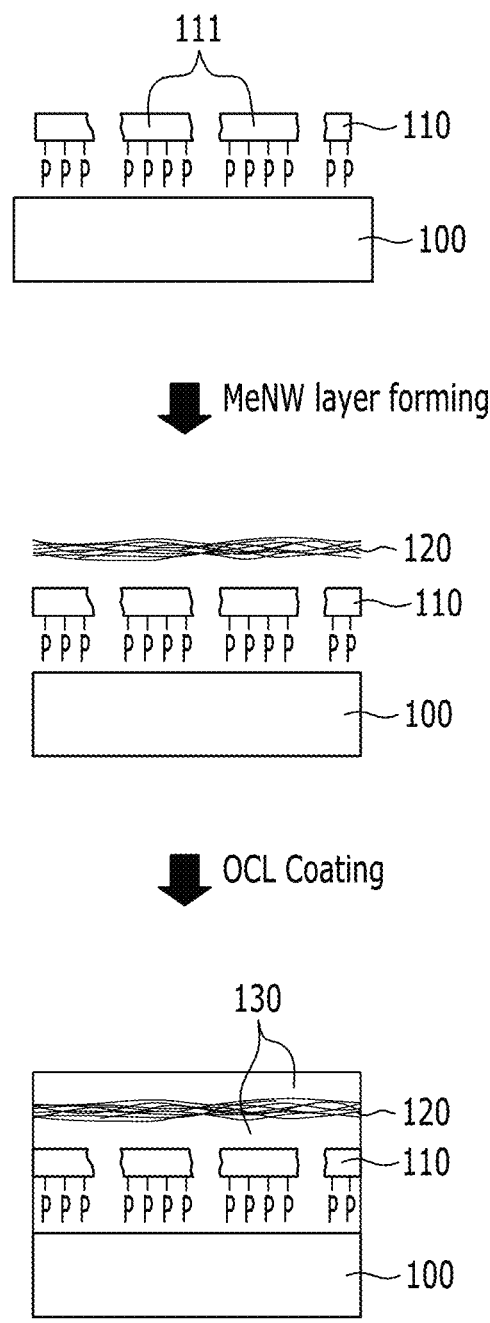
FIG. 11 is a flowchart showing a method of making a conductor of FIG. 4 using a laminate structure of the substrate and P-doped first conductive layer prepared as illustrated in FIG. 9.
Figure 12:
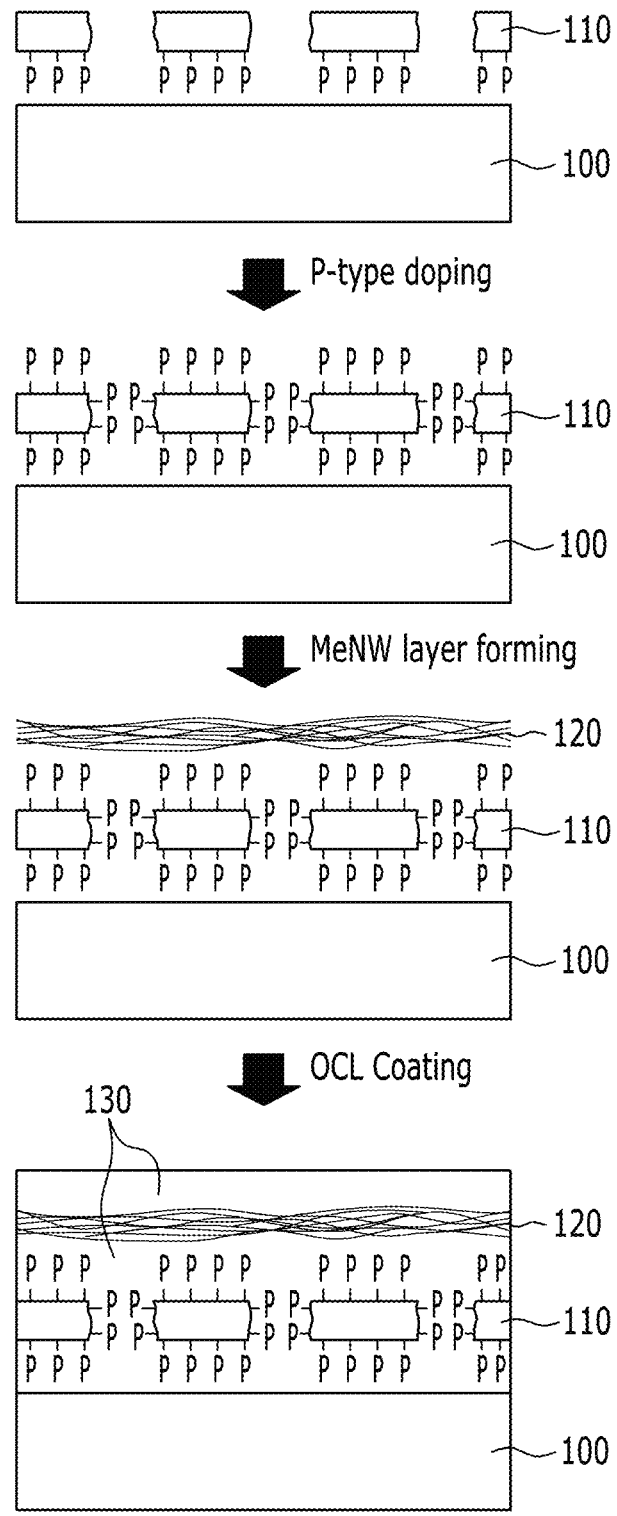
FIG. 12 is a flowchart showing a method of making a conductor of FIG. 6 using a laminate structure of the substrate and P-doped first conductive layer prepared as illustrated in FIG. 9.

FIG. 11 is a flowchart showing a method of making the conductor of FIG. 4 using the laminate structure of substrate/P-doped first conductive layer prepared as illustrated in FIG. 9; FIG. 12 is a flowchart showing a method of making the conductor of FIG. 6 using the laminate structure of substrate/P-doped first conductive layer prepared as illustrated in in FIG. 9.

Referring to FIGS. 11 and 12, basically, a second conductive layer 120 including conductive metal nanowire is formed directly on the first conductive layer 110 of the substrate/P-doped first conductive layer laminate structure prepared as illustrated in FIG. 9, and an overcoat layer (OCL) 130 is formed directly on the second conductive layer 120 to provide a conductor which includes sequentially laminated structure of substrate/P-doped first conductive layer/second conductive layer/overcoat layer. As shown in FIG. 11, the conductor shown in FIG. 4 is obtained in which the P-dopant is adsorbed only on the lower surface of island-shaped graphene 111 by sequentially performing the processes.

Also, in an embodiment, as shown in FIG. 12, a second-doping may be performed by contacting the P-type dopant-containing solution with the upper surface of the first conductive layer of the substrate/P-doped first conductive layer laminate structure before forming the second conductive layer. Thereby, as shown in FIG. 6, a conductor in which the P-type dopant is absorbed on all surfaces of island-shaped graphene is obtained.

Also, according to an embodiment, by sequentially forming the second conductive layer and the overcoat layer onto FIG. 10, a conductor in which only the upper surface and side surfaces of island-shaped graphene are adsorbed with P-type dopant as shown in FIG. 5, may be obtained.

As described above, the method of making a conductor according to an embodiment may provide the various conductors as shown in above FIGS. 4 to 6 by slightly changing the process (the order of substrate transferring, P-doping, additional P-doping).

The conductor obtained by the described methods is optically transparent, and has an excellent mechanical flexibility by hybridizing island-shaped graphene and conductive metal nanowires. The conductor may also have improved electrical conductivity and reliability through the P-doping treatment.

Hereinafter, the embodiments are illustrated in more detail with reference to examples. These examples, however, are not in any sense to be interpreted as limiting the scope of this disclosure.

EXAMPLES

Measurement Method:
[1] Measurement of sheet resistance: Sheet resistance is measured as follows.
Measurer: Mitsubishi Ioresta-GP (MCP-T610), ESP-type probes (MCP-TP08P)
Measurement reference: four-point probe method
Sample size: width 2 cm×length 2 cm
Measurement: average after repeating the measurement at least 9 times

[2] Line resistance measurement: Line resistance is measured as follows.
Measurer: ESP type probes (MCP-TP08P)
Measurement reference: two-point probe method (probes at opposing ends of the sample contact)
Sample size: width 2 cm×length 2 cm
Measurement: average after repeating the measurement at least 9 times

[3] Light transmittance measurement: Light transmittance is measured as follows.
Measurer: NIPPON DENSHOKU INDUSTRIES (NDH-7000 SP)
Sample size: width 2 cm×length 2 cm
Sample Measurement: average after repeating the measurement at least 9 times

[4] Haze measurement: Haze is measured as follows.
Measurer: NIPPON DENSHOKU INDUSTRIES (NDH-7000 SP)
Sample size: width 2 cm×length 2 cm
Sample Measurement: average after repeating the measurement at least 9 times

[5] Scanning Electron Microscope (SEM): Scanning electron microscopic analysis is performed using FE-SEM (Field Emission Scanning Electron Microscopy) Hitachi (SU-8030)

Fabrication of Example 1

A conductor is fabricated in accordance with the method shown in FIGS. 9 and 12.

[1] A chemical vapor deposition (CVD) is performed on one surface of copper substrate (Cu substrate) in an atmosphere including $CH_4$ gas as a hydrocarbon precursor supplying carbon atom, at a temperature of 1,000° C. for less than or equal to 1 minute to deposit two or more island-shaped graphene, and a polymethylmethacrylate (PMMA) film is coated and cured on the two or more island-shaped graphene. The resulting material is copper-etched (Cu etching) using a copper etchant (Cu etchant) of $FeCl_3$ or ammonium persulfate to provide an island-shaped graphene-release film laminate structure.

[2] Under-Doping
A P-type dopant-containing solution is prepared by dissolving 2,3,5,6-tetrafluoro-7,7,8,8-tetracyanoquinodimethane (F4-TCNQ) at a concentration of 0.2 mg/mL in a solvent that is a mixture of 20 mL of nitromethane and 5 mL of ethanol, and the island-shaped graphene-release film laminate structure is dipped into the P-type dopant-containing solution at room temperature for 5 minutes, and then removed. Subsequently, the island-shaped graphene-release film laminate structure is transferred directly onto a PET substrate so that the P-type doped surface is contacted to the PET substrate and dried, and then the release film is removed to provide a PET substrate-P-type doped island-shaped graphene laminate structure. Herein, the lower surface of island-shaped graphene contacting the upper surface of PET substrate is P-type adsorbed and doped with F4-TCNQ.

[3] Over-Doping
The PET substrate-P-type doped island-shaped graphene laminate structure obtained from step [2] is dipped into the P-type dopant-containing solution obtained from step [2] for 5 minutes, or bar-coated using a wired bar or spin-coated, and then removed. The resulting product is an island-shaped graphene laminate structure in which the exposed surfaces of island-shaped graphene (upper surface, side surfaces) are all P-type doped with F4-TCNQ.

[4] Subsequent Process

A silver nanowire-containing composition is prepared having the following components:

4.32 g of silver nanowire aqueous solution (concentration: 0.5 wt %, average diameter of silver nanowire: 20 nm)

Solvent: 7.416 g of water and 4.261 g of ethanol

Binder: 0.864 g of hydroxypropyl methyl cellulose aqueous solution (concentration: 0.25%)

The silver nanowire-containing composition is coated directly on the graphene island structure of the PET substrate-P-type doped island-shaped graphene laminate structure obtained from step [3] using a wired bar and dried under an air atmosphere at a temperature of 100° C. for 5 minutes to provide a second conductive layer composed of a silver nanowire layer.

Then, 1 g of urethane acrylate solute is added into 9 g of a solvent that includes diacetone alcohol and isopropyl alcohol and at a ratio of 5:5 to provide a mixed solution. Then the mixed solution is coated on the second conductive layer using a wired bar and dried at a room temperature for greater than or equal to 2 minutes. Subsequently, the resulting material is dried in an oven at 100° C. and cured by UV light to provide an overcoat layer, to obtain a conductor in which a PET substrate, a P-doped island-shaped graphene/silver nanowire layer/overcoat layer are sequentially stacked and hybridized.

Fabrication of Example 2

A conductor in which a substrate, P-doped island-shaped graphene/silver nanowire layer/overcoat layer are sequentially laminated may be obtained in accordance with the same procedure as in Example 1, except that the P-type dopant-containing solution is prepared by mixing F4-TCNQ in a solvent of 20 mL of nitromethane in a concentration of 0.2 mg/mL, and used for the over-doping and the under-doping steps.

Fabrication of Example 3

A conductor in which a substrate, P-doped island-shaped graphene/silver nanowire layer/overcoat layer are sequentially laminated and hybridized is obtained in accordance with the same procedure as in Example 1, except that the P-type dopant-containing solution is prepared by mixing F4-TCNQ in a solvent of 20 mL of nitromethane in a concentration of 1.0 mg/mL and used for the over-doping and the under-doping steps.

Fabrication of Comparative Example 1

The silver nanowire-containing composition obtained from step [4] in Example 1 is coated directly on the PET substrate using a wired bar and dried at a temperature of 100° C. for 5 minutes under the air atmosphere to provide a silver nanowire layer.

Then the mixed solution prepared in step [4] of Example 1, in which 1 g of urethane acrylate solute is added into 9 g of solvent including diacetone alcohol and isopropyl alcohol mixed at a ratio of 5:5, is coated directly on the silver nanowire layer using a wired bar and then dried at a room temperature for greater than or equal to 2 minutes.

Subsequently, the obtained resulting material is dried in an oven at 100° C. and cured by a UV curer to provide an overcoat layer, so that it may obtain a conductor that PET substrate-silver nanowire layer-overcoat layer are sequentially laminated.

Fabrication of Comparative Example 2

[1] A conductor in which PET substrate-island-shaped graphene/silver nanowire layer/overcoat layer are sequentially laminated is obtained in accordance with the procedure as in Example 1, except omitting the P-doping steps.

[2] More specifically, the island-shaped graphene-release film laminate structure is transferred directly on a PET substrate and dried, and the release film is removed to provide a PET substrate-island-shaped graphene laminate structure.

[3] Then the silver nanowire-containing composition obtained from step [4] in Example 1 is coated directly on the island-shaped graphene using a wired bar and dried under the air atmosphere at a temperature of 100° C. for 5 minutes to provide a second conductive layer of silver nanowire layer. Then the mixed solution obtained from step [4] in Example 1, in which 1 g of urethane acrylate solute is added into 9 g of solvent including diacetone alcohol and isopropyl alcohol mixed at a ratio of 5:5, is coated directly on the silver nanowire layer using a wired bar and dried at a room temperature for greater than or equal to 2 minutes.

[4] Subsequently, the obtained resulting material is dried in an oven at 100° C. and cured by a UV light to provide an overcoat layer, to obtain a conductor in which PET substrate/island-shaped graphene (undoped)/silver nanowire layer/overcoat layer are sequentially laminated.

Evaluation 1: Evaluating Electric and Optical Properties of Example 1 and Comparative Example 2

The P-doped island-shaped graphene-silver nanowire hybridized conductor (Example 1) and the undoped island-shaped graphene-silver nanowire hybridized conductor (Comparative Example 2) are measured to determine a sheet resistance (Rs), a light transmittance (TT) and a haze, and the results are shown in Table 1.

TABLE 1

| | Rs (ohm/sq) | TT (%) | Haze (%) |
|---|---|---|---|
| Example 1 (P-doped) | 31.2 | 90.11 | 1.34 |
| Comparative Example 2 (undoped) | 33.9 | 90.66 | 1.32 |

Referring to Table 1, it is confirmed that Example 1 and Comparative Example 2 having the same sequentially laminated structure of PET substrate-island-shaped graphene-silver nanowire-overcoat layer, except that Example 1 is P-doped, have the relatively similar electrical, optical properties. However, as Example 1 (P-doped) has a decreased sheet resistance relative to Comparative Example 2, it is understood that Example 1 may have increased electrical conductivity.

Also, the light transmittance and the haze of Example 1 are similar levels to those of Comparative Example 2, so it is understood that the conductor of Example may also have excellent optical properties (light transmittance and haze) enough to be employed for the optically transparent devices.

Evaluation 2: Evaluation of Adhesion of Example 1, Comparative Example 1, and Comparative Example 2 Using Universal Testing Machine (UTM)

Figure 13:
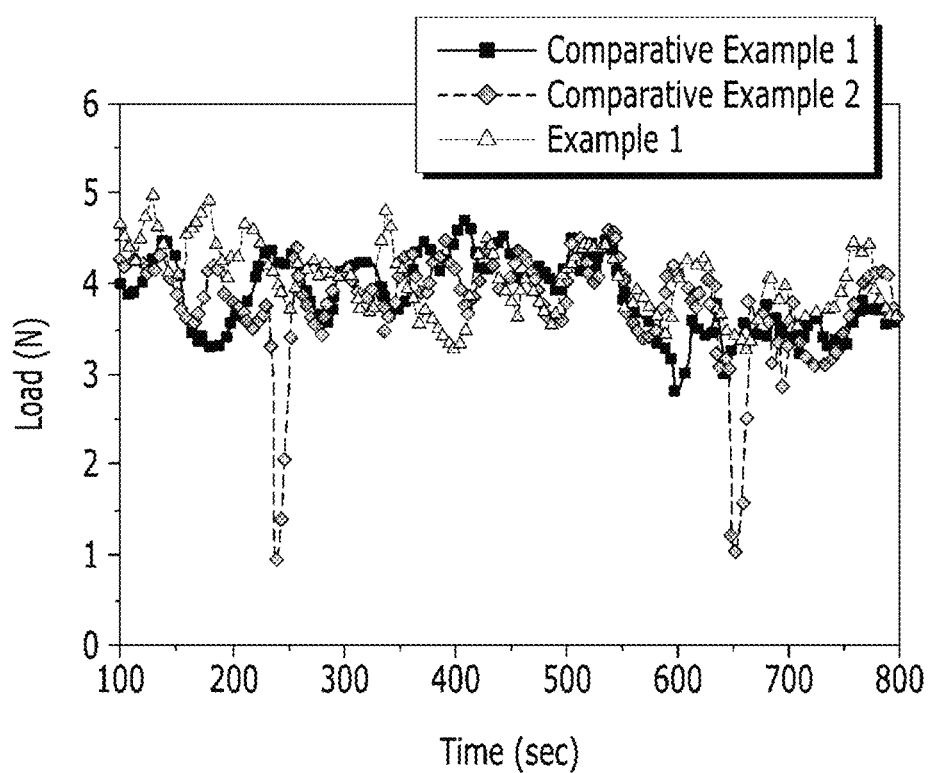
FIG. 13 is a graph of load (Newtons, N) versus time (seconds, sec) showing the results of an adhesion test for Example 1, Comparative Example 1, and Comparative Example 2.

The conductors of Example 1, Comparative Example 1, and Comparative Example 2 are processed to have a width of greater than or equal to 20 cm×length of 2 cm, and an adhesive tape (e.g. Scotch® tape) is attached thereto along with the center of each conductor sample. Then the conductor sample is positioned to lie in a horizontal direction and fixed, and one terminal end of Scotch® tape attached to the conductor sample is fixed by a UTM head. Then the head rises along the same direction as the laminated direction of the conductor at a rate of 1 cm/min for 800 seconds (peel angle: 180°) and while the adhesion (load) applied to the Scotch® tape is peeled off, the adhesion (load) change applied to the Scorch® tape is measured according to a lapse of time. The results are shown in FIG. 13. The rising up speed of the head for the UTM evaluation may be controlled within a range from 0.1 cm/min to 10 cm/min.

Also, after completing the adhesion (load) measurement, the specimens of Example 1, Comparative Example 1, and Comparative Example 2 are observed by a scanning electron microscope (SEM), and the results are shown in as images of FIGS. 14 to 19.

FIG. 13 is a graph showing the results of evaluating adhesion for Example 1, Comparative Example 1, and Comparative Example 2.

Referring to FIG. 13, based on the adhesion of an average of 4N, only minute changes are measured in Example 1 and Comparative Example 1, but it is observed that in Comparative Example 2, the adhesion is remarkably deteriorated in a range from 220 seconds to 280 seconds, and between 640 seconds to 700 seconds.

The reason why the adhesion is deteriorated in Comparative Example 2 may be because the adhesion between the island-shaped graphene and the substrate and/or the overcoat layer is relatively weak; the structure is only hybridized in the region where the overcoat layer is directly connected to the substrate by permeating the overcoat layer through the opening regions defined by the island-shaped graphene and in the region where the overcoat layer and the substrate are not directly connected by covering the island-shaped graphene on the upper surface of substrate.

The reasons why the adhesion is maintained in a certain level in Comparative Example 1 may be because the conductor has a structure in which the overcoat layer, permeated through pores of the mesh structure-shaped silver nanowire layer, is directly connected to most of the upper surface of substrate.

When compared with Comparative Example 1 and Comparative Example 2, Example 1 improves adhesion of the island-shaped graphene with the substrate and/or overcoat layer due to the P-doping, so it is understood that the adhesion may be maintained at a predetermined level with no region where the adhesion is significantly decreased, unlike Comparative Example 2. In other words, an embodiment may provide a conductor having a high reliability by maintaining adhesion in a predetermined level as in Example 1.

Figure 14:
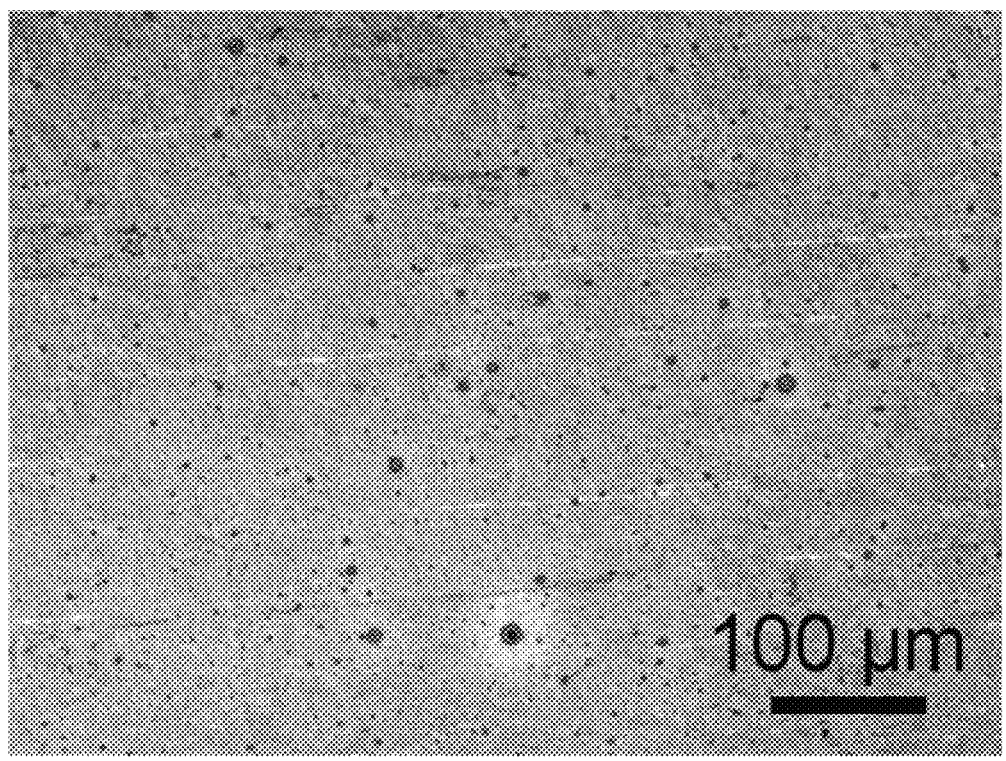
FIGS. 14 to 16 are SEM images (1000× magnification) of a surface of Comparative Example 1, Comparative Example 2, and Example 1, respectively, after performance of the adhesion evaluation.
Figure 15:
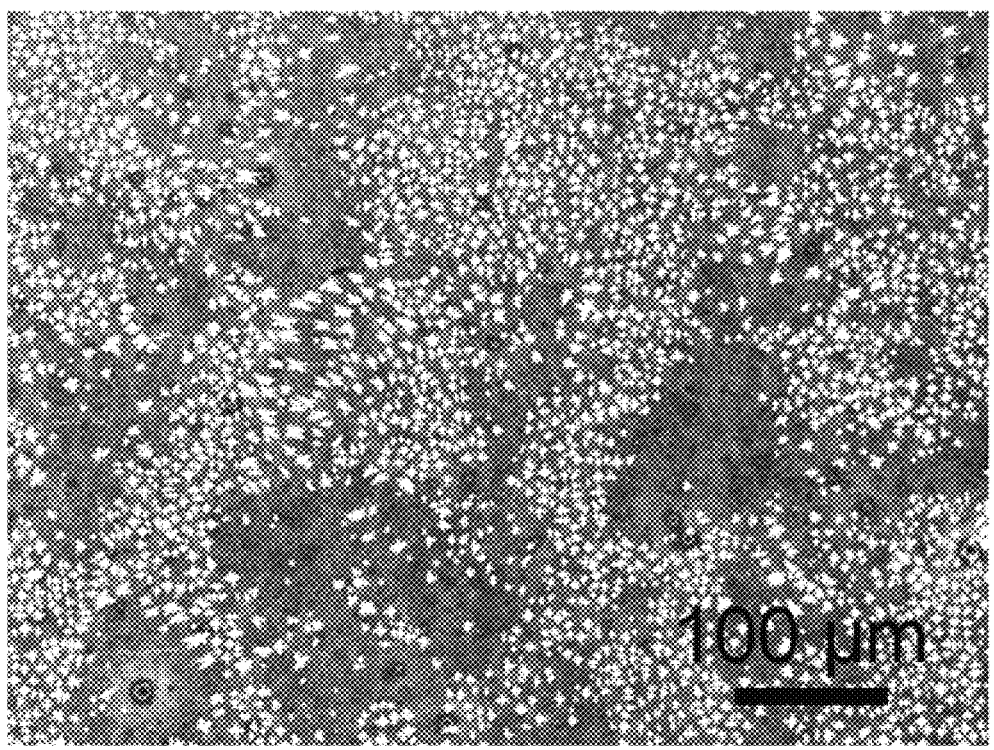
Figure 16:
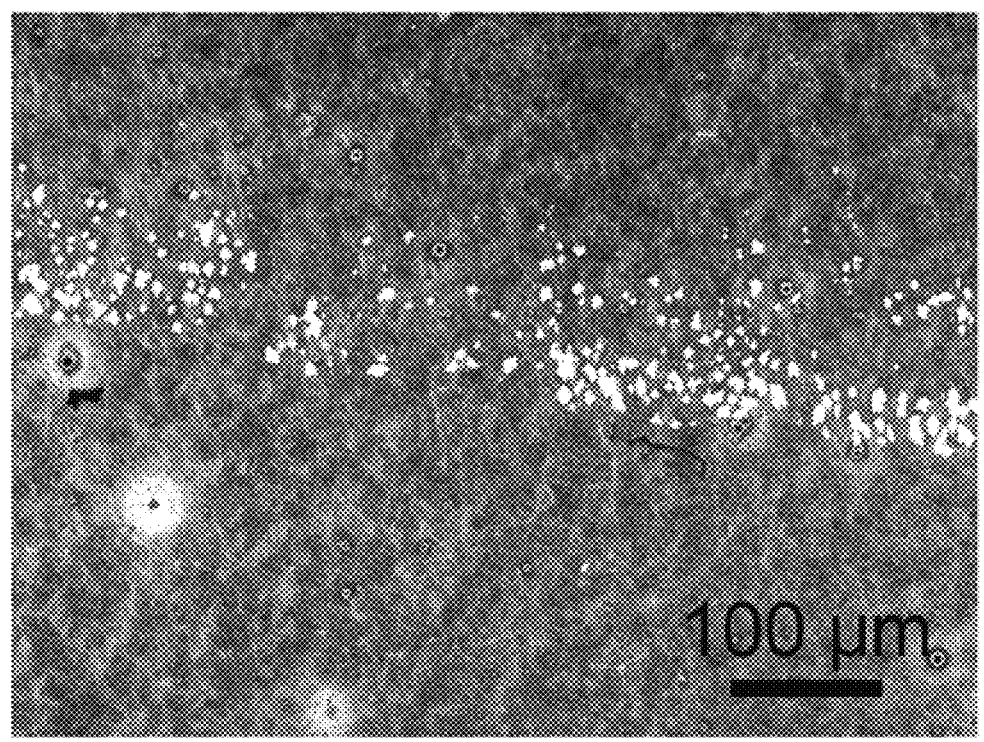
Figure 17:
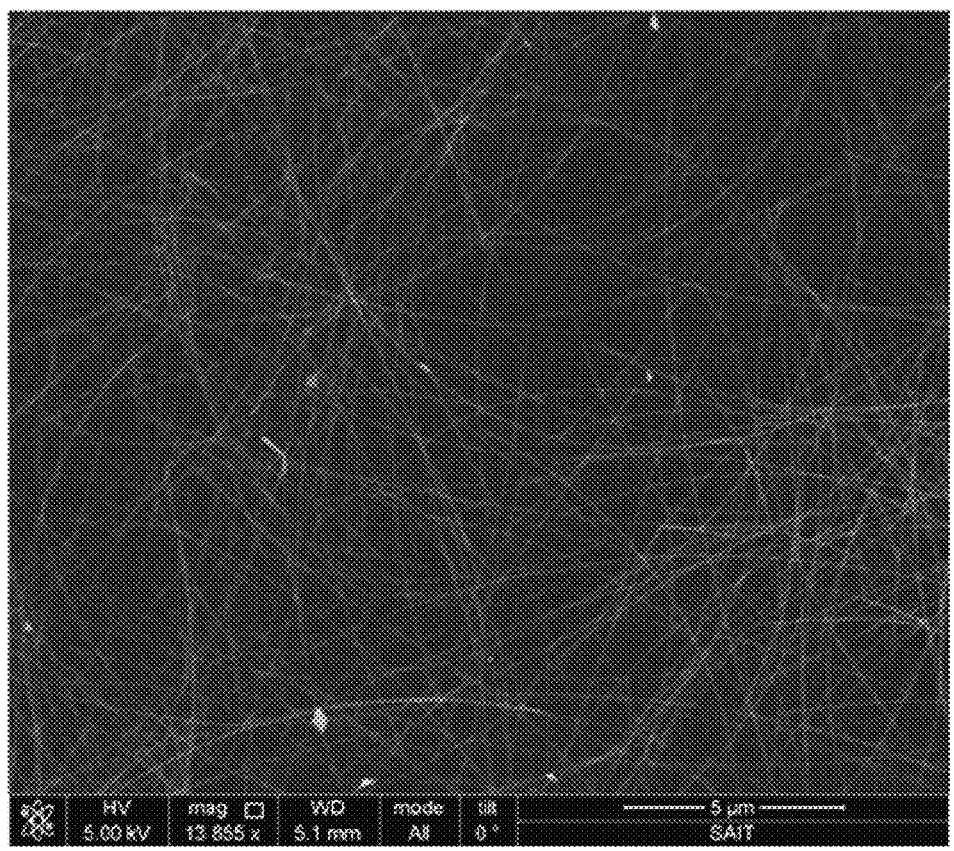
FIGS. 17 to 19 are enlarged SEM images of Comparative Example 1 (32,000× magnification), Comparative Example 2 (20,000× magnification), and Example 1 (20,000× magnification), respectively, after performance of the adhesion evaluation.
Figure 18:
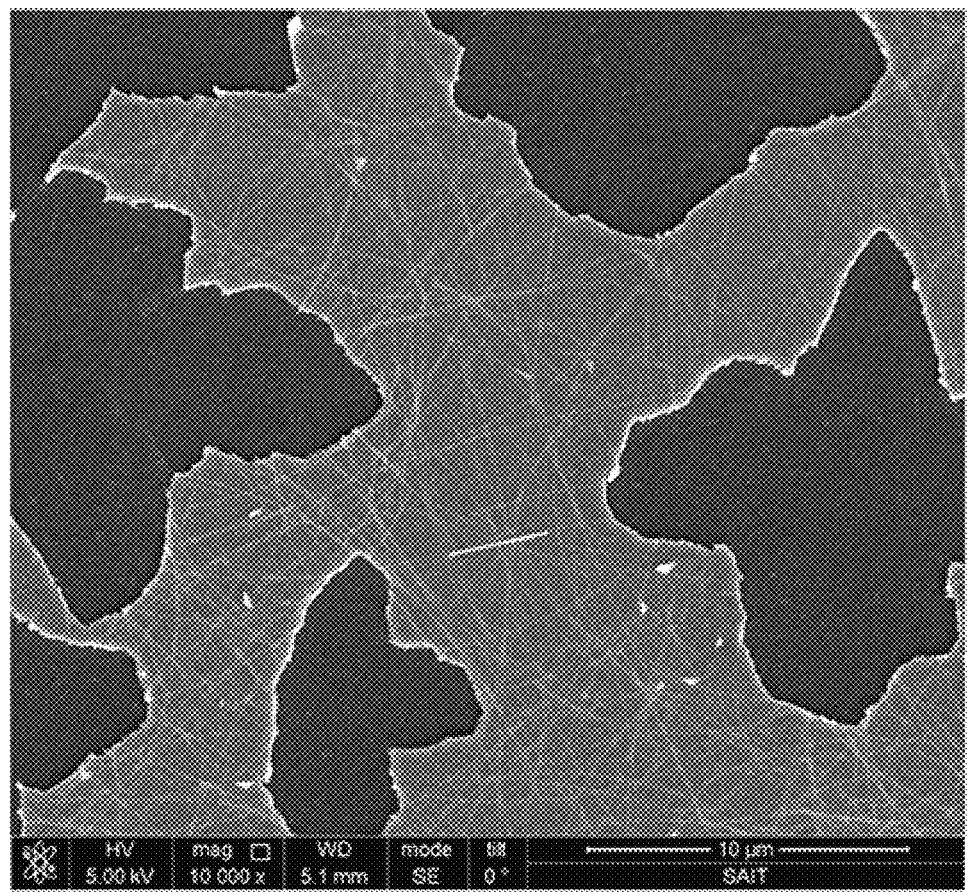
Figure 19:
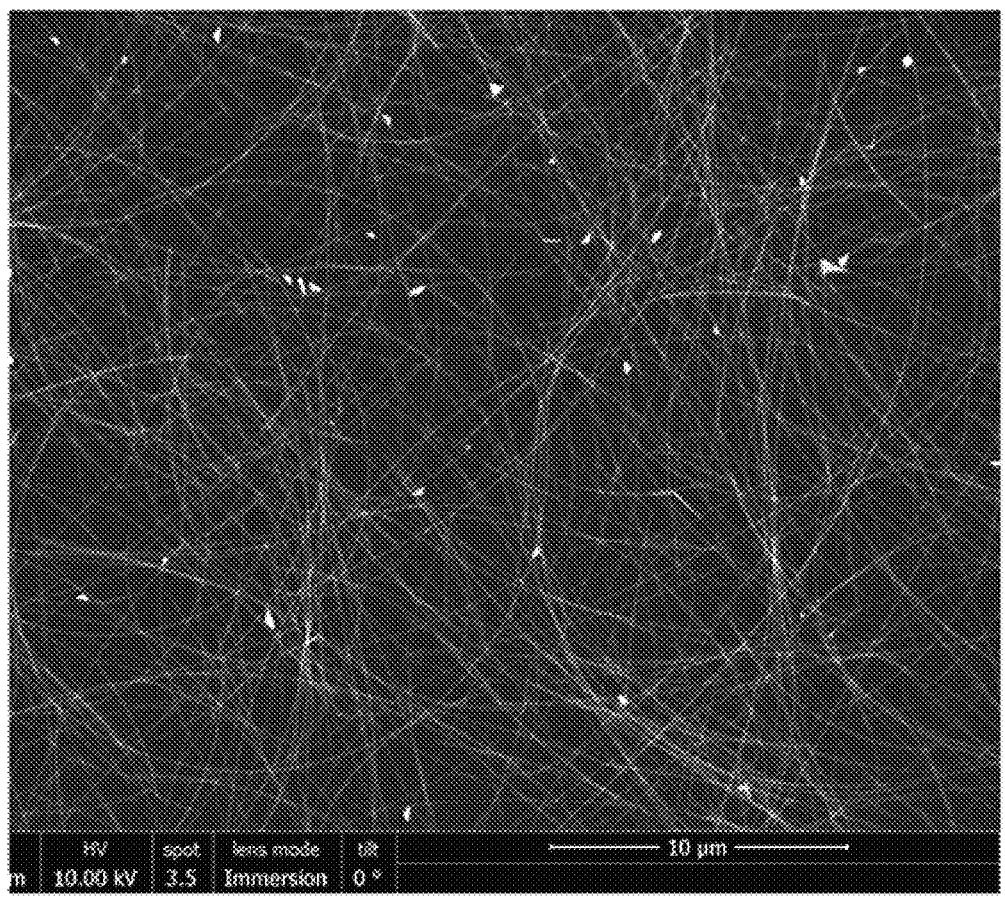

FIGS. 14 to 19 are SEM images showing the surfaces of Comparative Example 1, Comparative Example 2, and Example 1 after performance of the adhesion evaluation: FIGS. 14 to 16 are enlarged images (1,000× magnification) of the specimens of Comparative Example 1, Comparative Example 2, and Example 1, respectively; FIGS. 17 to 19 are further enlarged images of the specimens of Comparative Example 1 (32,000× magnification), and Comparative Example 2 (20,000× magnification), Example 1 20,000× magnification, respectively.

Referring to FIGS. 14 and 17, it is confirmed that the overcoat layer or the silver nanowire inside are not delaminated or damaged in Comparative Example 1 after the adhesion evaluation.

However, in the case of Comparative Example 2, the bright millet shapes observed in the image of FIG. 15, and the brighter part observed in the image of FIG. 18, indicate areas of delamination or damage between the silver nanowire/overcoat layer and the island-shaped graphene, or between the island-shaped graphene and the substrate.

Comparing to Comparative Example 2, the internal damage rarely occurs in Example 1, as observed in FIG. 16, and the structure is same as what is shown in FIG. 19.

In other words, the results of evaluating the adhesion of Comparative Example 1, Comparative Example 2, and Example 1 using a universal testing machine, show that the adhesion of Example 1 is highly reliable when compared to Comparative Example 2 having the same laminated structure.

Evaluation 3: Evaluation of Number of Defects of Example 1 to Example 3 and Comparative Example 2 According to Kind of Organic Solvent and Concentration of Dopant Using the universal testing Machine (UTM) in accordance with the same procedure as in Evaluation 2, the adhesion evaluation for the conductors of Examples 1 to 3 and Comparative Example 2 is performed, and then the number of defects observed on the surface of conductors of Examples 1 to 3 and Comparative Example 2 are counted, and the results are shown in FIGS. 20 to 23 and Table 2.

Figure 20:
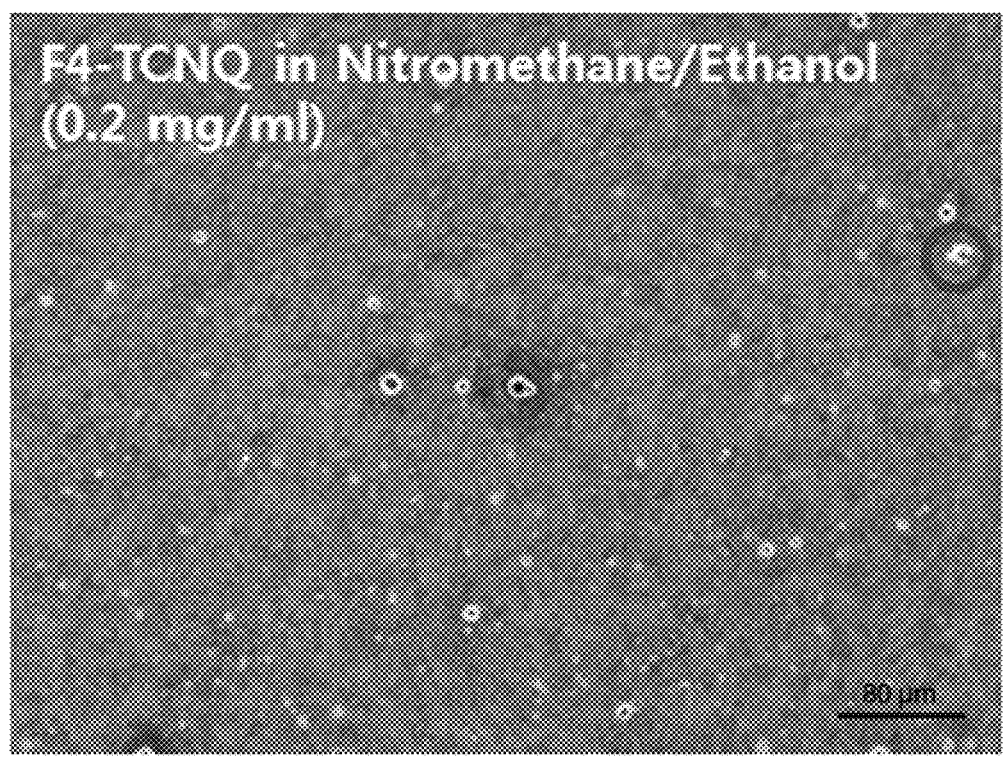
Figure 21:
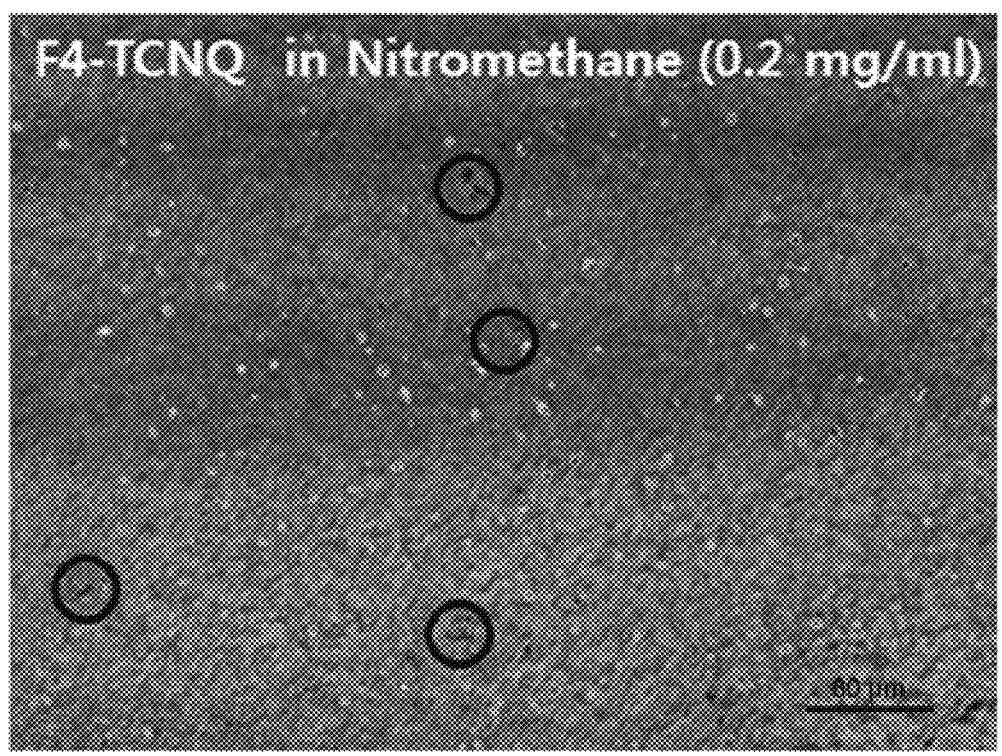
Figure 22:
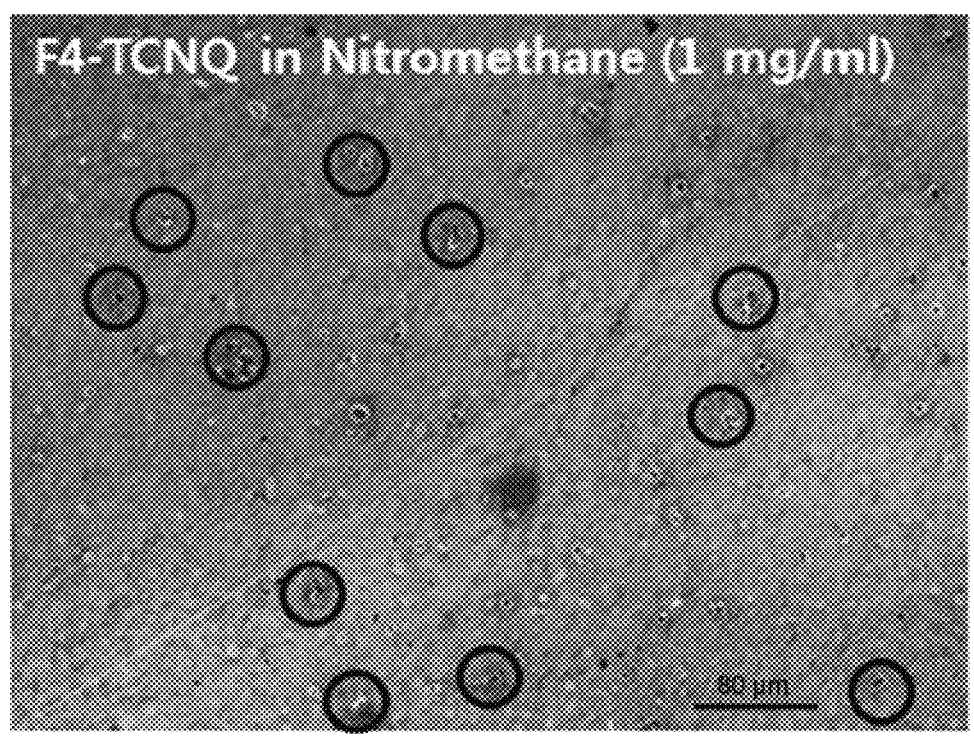
Figure 23:
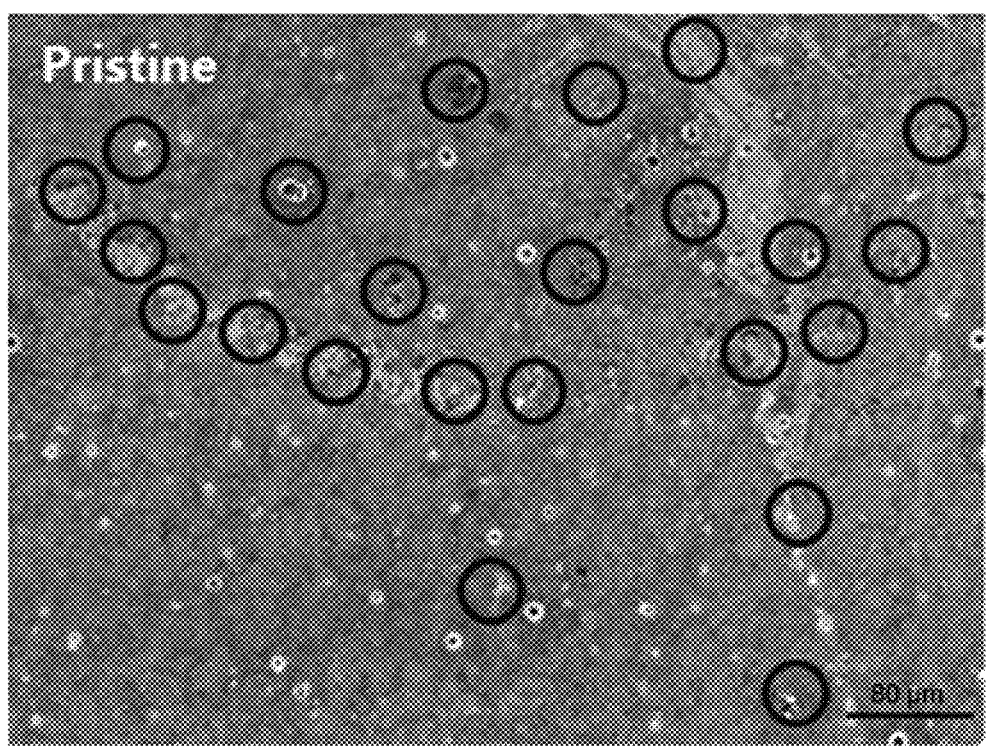

FIGS. 20 to 23 are respectively enlarged SEM images (1,000× magnification) of a surface of Comparative Example 2, Example 1, Example 2, Example 3 after performance of the tape evaluation: FIG. 20 shows Example 1, FIG. 21 shows Example 2, FIG. 22 shows Example 3, and FIG. 23 shows Comparative Example 2.

TABLE 2

| | P-doped or undoped | Used organic solvent | Dopant concentration (mg/mL) | Number of defects |
|---|---|---|---|---|
| Example 1 | O | nitromethane + ethanol | 0.2 | 1 |
| Example 2 | O | nitromethane | 0.2 | 4 |
| Example 3 | O | nitromethane | 1 | 13 |
| Comparative Example 2 | X | NA* | NA | 23 |

*In Table 2, NA indicates Not Available.

Referring to Table 2 and FIGS. 20 to 22, it is confirmed that, the number of defects is different depending upon the kind of organic solvent used and the dopant concentration in the P-type dopant-containing solution, even in the cases of Example 1 to Example 3 P-doped with F4-TCNQ.

Among them, Example 1 using the organic solvent of nitromethane and ethanol and adjusting the dopant concentration to 0.2 mg/mL has least number of defects (referring to Table 2 and FIG. 20). It is believed that this is because ethanol included in the organic solvent may improve the wettability of the P-type dopant-containing solution on the surface of island-shaped graphene.

In addition, when only nitromethane is used as the organic solvent, it is confirmed that less defects are found in Example 2 having a dopant concentration of 0.2 mg/mL than in Example 3 having a dopant concentration of 1.0 mg/mL (referring to Table 2 and FIGS. 21 and 22). Therefrom, it is believed that the P-doping of the surface of island-shaped graphene is inhibited when too much of the P-type dopant is included in the P-type dopant-containing solution.

Also, it is confirmed that the number of defects is remarkably increased in the undoped Comparative Example 2 compared to Example 1 to Example 3 (referring to Table 2 and FIG. 23).

Evaluation 4: Bending Evaluation of Example 1, Comparative Example 2

Figure 24:
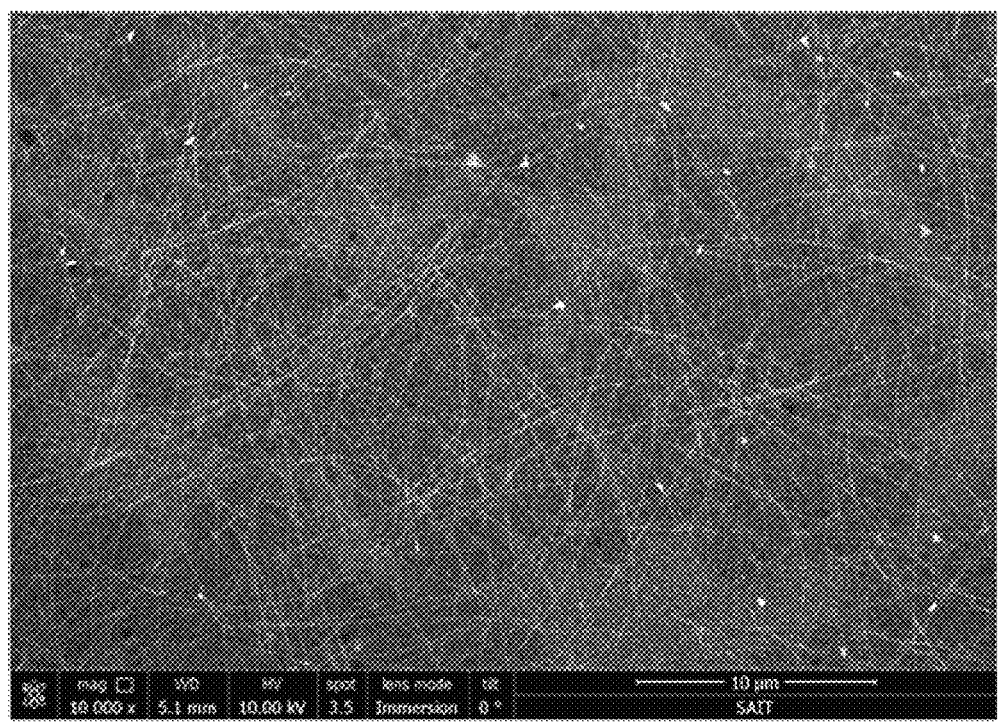
FIGS. 24 and 25 are SEM images of Example 1 before and after performing a bending evaluation, respectively.
Figure 26:
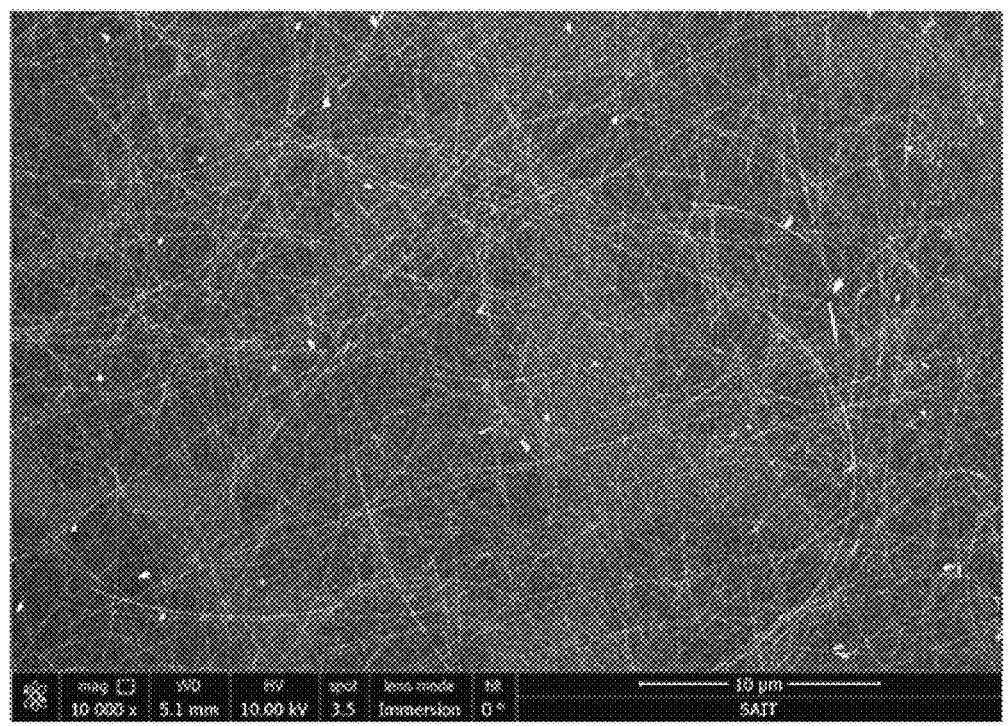
FIGS. 26 and 27 are SEM images of Comparative Example 2 before and after performing a bending evaluation, respectively.

First, the conductors obtained from Example 1 and Comparative Example 2 are each measured for an initial line resistance 4 times according to a 2-point probe method. In addition, the surface images of the conductors obtained from Example 1 and Comparative Example 2 are taken, and the results are shown in FIGS. 24 and 26, respectively.

Figure 25:
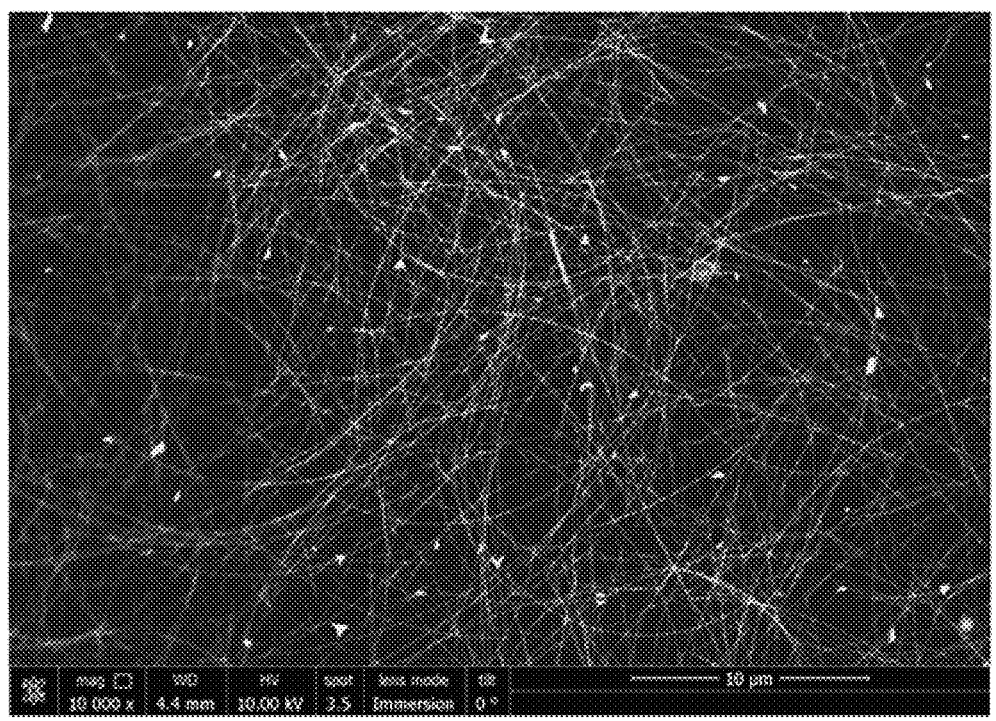
Figure 27:
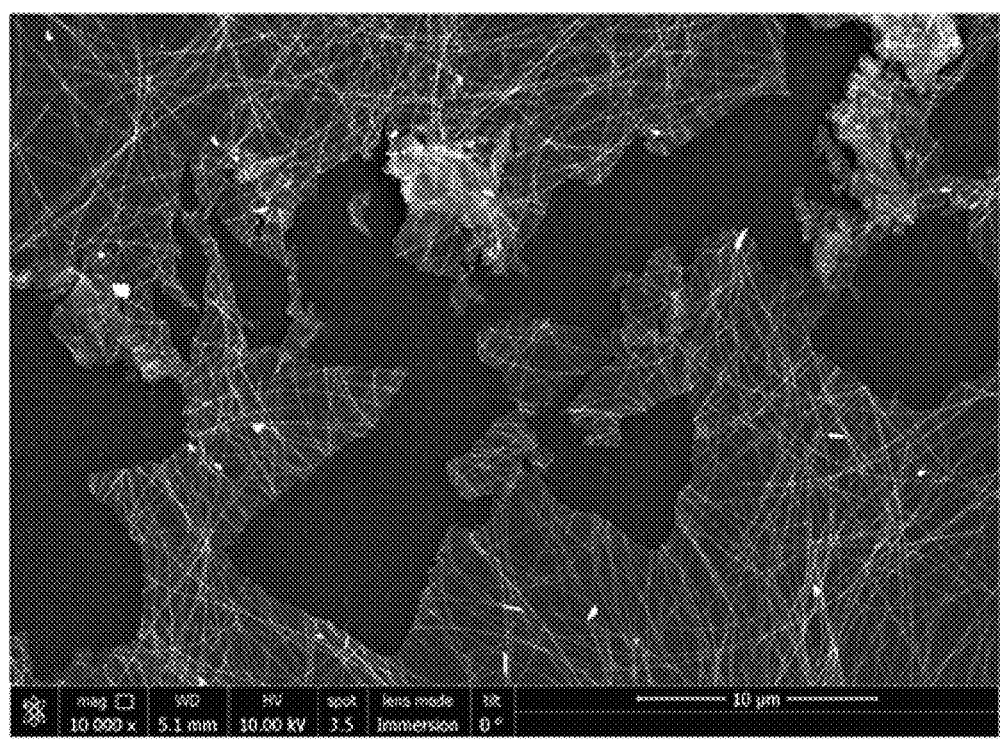

Then using a cyclic bending tester, the conductors obtained from Example 1 and Comparative Example 2 are folded at a curvature radius of 1R (1 mm) and repeated for 200,000 times. After completing the process, the conductors obtained from Example 1 and Comparative Example 2 are each measured 4 times to determine a final line resistance using a 2-point probe method. In addition, the surface images of the conductors according to Example 1 and Comparative Example 2 are taken (SEM) after completing the bending test, and the results are shown in FIGS. 25 and 27, respectively.

From the initial line resistance measured before the bending test and the final line resistance measured after the bending test, the line resistance variation ratio is calculated. The initial line resistance, the final line resistance and the line resistance variation ratio are shown in the following Table 3.

The line resistance variation ratio may be calculated as in the following Equation 1:

Line resistance variation ratio [%]=(final line resistance−initial line resistance)/initial line resistance×100%   Equation 1

TABLE 3

| | Initial line resistance (ohm) | Final line resistance (ohm) | Variation ratio of line resistance (%) | Average initial line resistance (ohm) | Final line resistance average (ohm) | Average variation ratio of line resistance (%) |
|---|---|---|---|---|---|---|
| Example 1 | 206.1 | 240.5 | 16.7 | 197.2 | 230.5 | 16.9 |
| | 175.1 | 202.4 | 15.6 | | | |
| | 215.3 | 249.2 | 15.8 | | | |
| | 192.2 | 230.0 | 19.7 | | | |
| Comparative Example 2 | 162.0 | 241.3 | 49.0 | 168.5 | 268.1 | 59.1 |
| | 186.7 | 272.4 | 45.9 | | | |
| | 157.7 | 229.1 | 45.3 | | | |
| | 167.7 | 329.4 | 96.4 | | | |

FIGS. 24 and 25 are SEM images of Example 1 before and after performing the bending evaluation: FIG. 24 is an image taken before performing the bending evaluation, and FIG. 25 is an image taken after performing the bending evaluation. FIGS. 26 and 27 are SEM images of Comparative Example 2 before and after performing the bending evaluation: FIG. 26 is an image before performing the bending evaluation, and FIG. 27 is an image after performing the bending evaluation.

It is confirmed that the initial Example 1 and Comparative Example 2 show the similar line resistance and surface image (Referring to Table 3 and FIGS. 24 and 26). However, the line resistance variation ratio calculated based on the final line resistance after bending for 200,000 times is an average of 16.9%, in Example 1, which is not over 20%. On the other hand, in Comparative Example 2, the final line resistance after bending for 200,000 times is recorded as 96.4% at maximum and averaged as 59.1%.

The above is also confirmed from the surface images of Example 1 and Comparative Example 2 after repeated bending for 200,000 times. It is confirmed that the surface is little changed from the initial stage in the case of Example 1 (referring to FIGS. 24 and 25), whereas in the case of Comparative Example 2, it is confirmed that the island-shaped graphene, the silver nanowire layer, and the overcoat layers are remarkably delaminated (referring to FIGS. 26 and 27).

In other words, in Example 1, the line resistance variation ratio for the bending evaluation is about 30% on average, less than the line resistance variation ratio of Comparative Example 2. In other words, an embodiment may provide a conductor having excellent reliability, even in the case where the conductor is applied with repeated physical impacts, when it is P-doped on the surface of island-shaped graphene, as in Example 1.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductor comprising:
   a substrate,
   a first conductive layer disposed on the substrate and comprising two or more islands comprising graphene, and
   a second conductive layer disposed directly on the first conductive layer and comprising a conductive metal nanowire,
   wherein at least one of an upper surface and a lower surface of the two or more islands comprising graphene comprises a P-type dopant, and
   wherein the conductive metal nanowire electrically connects a first island and a second island of the first conductive layer.

2. The conductor of claim 1, wherein at least one island of the two or more islands comprising graphene is a monolayer or a multilayer of ten or less layers.

3. The conductor of claim 1, wherein a side surface of the islands comprising graphene comprises the P-type dopant.

4. The conductor of claim 3, wherein the upper surface, the lower surface, and the side surface of the island comprising graphene each comprise the P-type dopant.

5. The conductor of claim 1, wherein the P-type dopant comprises dichloro dicyano quinone, potassium monopersulfate triple salt, dimyristoyl phosphatidylinositol, benzimidazole, bis(trifluoromethanesulfonyl)amide, bis(trifluoromethane)sulfonimide, N,N-di(1-naphthyl)-N,N-diphenylbenzidine, 2,3,5,6-tetrafluoro-7,7,8,8-tetracyanoquinodimethane, 7,8,8-tetracyanoquinodimethane, tetracyanoethylene, tetrakis(dimethylamino)ethylene, anthracene, melamine, 9,10-dibromoanthracene, 1,3,6,8-pyrenetetrasulfonic acid, polymethylmethacrylate, polyvinylidene difluoride, poly(ethyleneoxide), triazine, 1,5-naphthalenediamine, 9,10-dimethylanthracene, or a combination thereof.

6. The conductor of claim 1, wherein the P-type dopant has both a functional group capable of being adsorbed on the graphene and a hydrophilic group.

7. The conductor of claim 1, wherein a work function of the P-type dopant is greater than or equal to about 4.5 electron volts.

8. The conductor of claim 1, wherein the second conductive layer comprises a nanowire mesh structure comprising a plurality of entangled conductive metal nanowires.

9. The conductor of claim 8, wherein the conductor further comprises an overcoat layer disposed on an upper surface of the second conductive layer.

10. The conductor of claim 9, wherein the overcoat layer is physically connected to the substrate through the second conductive layer and the first conductive layer.

11. The conductor of claim 1, wherein a sheet resistance of the conductor is about 1 ohm per square to about 100 ohm per square.

12. The conductor of claim 1, wherein the substrate comprises an oxide glass, a silica glass, a polyester, polyethylene terephthalate, polybutylene terephthalate, polyethylene naphthalate, polycarbonate, polyimide, an acryl polymer, cellulose, a cellulose derivative, polyimide, an organic/inorganic hybrid material, or a combination thereof.

13. The conductor of claim 1, wherein the conductive metal nanowire comprises silver, copper, gold, aluminum, cobalt, palladium, or a combination thereof.

14. An electronic device comprising the conductor of claim 1.

15. The electronic device of claim 14, wherein the electronic device is a flat panel display, a touch screen panel, a solar cell, an e-window, an electrochromic mirror, a heat mirror, a transparent transistor, or a flexible display.

16. A method of making a conductor, comprising,
forming a first conductive layer comprising two or more islands comprising graphene,
disposing the first conductive layer on a substrate, and
forming a second conductive layer directly on the first conductive layer to make the conductor,
wherein the second conductive layer comprises a conductive nanowire,
wherein the conductive metal nanowire electrically connects a first island and a second island of the first conductive layer,
wherein the method further comprises contacting an exposed surface of the two or more islands comprising graphene with a P-type dopant-containing solution to perform a first P-doping on the exposed surface to form a first P-doped surface of the first conductive layer, and
wherein the contacting is performed between the forming of the first conductive layer and the disposing of the first conductive layer on the substrate, or between the disposing of the first conductive layer on the substrate and the forming of the second conductive layer.

17. The method of claim 16, wherein the first P-doping is performed between the forming of the first conductive layer and the disposing of the first conductive layer on the substrate, and
in the disposing of the first conductive layer on the substrate, the first P-doped surface of the first conductive layer is opposite to a surface of the substrate.

18. The method of claim 17, wherein in the disposing of the first conductive layer on the substrate,
an upper surface of the first conductive layer is contacted with the P-type dopant-containing solution to perform a second P-doping.

19. The method of claim 16, wherein the P-type dopant-containing solution comprises a P-type dopant and an organic solvent, and
wherein the organic solvent comprises an alcohol, an ether, an alcohol ether, a ketone, an amide, a sulfoxide, a sulfone, a nitrile, an amine, an ester, a carboxylate ester, an aromatic hydrocarbon, an aliphatic hydrocarbon, a halogenated hydrocarbon, a carbonate, a nitro group-containing solvent, or a combination thereof.

20. The method of claim 16, wherein the P-type dopant is present at a concentration of less than or equal to about 0.5 milligrams per milliliter, based on a total volume of the P-type dopant-containing solution.

* * * * *